United States Patent
Park

(10) Patent No.: US 11,494,116 B2
(45) Date of Patent: Nov. 8, 2022

(54) MEMORY DEVICE FOR PROGRAMMING DUMMY PAGES, MEMORY CONTROLLER FOR CONTROLLING THE MEMORY DEVICE AND MEMORY SYSTEM HAVING THE SAME

(71) Applicant: SK hynix Inc., Gyeonggi-do (KR)

(72) Inventor: Se Chang Park, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 324 days.

(21) Appl. No.: 16/424,092

(22) Filed: May 28, 2019

(65) Prior Publication Data
US 2020/0142637 A1 May 7, 2020

(30) Foreign Application Priority Data
Nov. 5, 2018 (KR) .......................... 10-2018-0134703

(51) Int. Cl.
| | |
|---|---|
| *G06F 3/06* | (2006.01) |
| *G11C 16/26* | (2006.01) |
| *G11C 16/34* | (2006.01) |
| *G11C 16/04* | (2006.01) |

(52) U.S. Cl.
CPC .......... *G06F 3/0659* (2013.01); *G06F 3/0604* (2013.01); *G06F 3/0656* (2013.01); *G06F 3/0673* (2013.01); *G11C 16/26* (2013.01); *G11C 16/3495* (2013.01); *G11C 16/0483* (2013.01)

(58) Field of Classification Search
CPC .......... G11C 7/14; G11C 11/56; G11C 16/10; G06F 12/0246; G06F 3/0659; G06F 3/0656; G06F 3/0673; G06F 3/0604
See application file for complete search history.

(56) References Cited

U.S. PATENT DOCUMENTS

| | | | | |
|---|---|---|---|---|
| 2007/0279999 A1* | 12/2007 | Watanabe | .......... | G11C 16/3445 365/185.23 |
| 2010/0214862 A1* | 8/2010 | Kim | .......... | G11C 5/14 365/226 |
| 2010/0315876 A1* | 12/2010 | Park | .......... | G11C 16/26 365/185.18 |
| 2015/0081949 A1* | 3/2015 | D'Abreu | .......... | G11C 16/3427 711/103 |

(Continued)

FOREIGN PATENT DOCUMENTS

| | | |
|---|---|---|
| KR | 10-2014-0026145 | 3/2014 |
| KR | 10-2014-0073817 | 6/2014 |
| KR | 10-2016-0072883 | 6/2016 |

*Primary Examiner* — Ramon A. Mercado
(74) *Attorney, Agent, or Firm* — IP&T Group LLP

(57) ABSTRACT

There are provided a memory controller and a memory system having the same. The memory controller includes: a central processing unit configured to output a read command for checking an erase state of a selected storage region in response to a program request from a host, determine the number of dummy pages according to the erase state, and output a program command according to the number of dummy pages; and a memory interface configured to, when user data corresponding to the program request is output to the selected storage region, selectively generate dummy data corresponding to the number of dummy pages, and output the dummy data with the user data.

18 Claims, 18 Drawing Sheets

(56) References Cited

U.S. PATENT DOCUMENTS

2015/0095558 A1* 4/2015 Kim .................. G11C 16/10
                                              711/103
2017/0109085 A1* 4/2017 Jinzenji ............ G06F 12/0246
2018/0150297 A1* 5/2018 Batley ................. G06F 9/3867

* cited by examiner

[S13] : th2 ≤ Vth < th1 | 1_DP

[S13] : th3 ≤ Vth < th2 | 2_DP

[S13] : Vth < th3 | 3_DP

MEMORY DEVICE FOR PROGRAMMING DUMMY PAGES, MEMORY CONTROLLER FOR CONTROLLING THE MEMORY DEVICE AND MEMORY SYSTEM HAVING THE SAME

CROSS-REFERENCE TO RELATED APPLICATION

The present application claims priority under 35 U.S.C. § 119(a) to Korean patent application number 10-2018-0134703, filed on Nov. 5, 2018, which is incorporated by reference in its entirety.

BACKGROUND

1. Field of Invention

Various embodiments of the present disclosure generally relate to a memory controller and a memory system having the same, and more particularly, to a program method of a memory system.

2. Description of Related Art

A memory system may include a memory device for storing data and a memory controller for controlling the memory device in response to a request from a host.

The memory device may be classified into a volatile memory device and a nonvolatile memory device according to whether or not stored data is lost when the supply of power is interrupted.

The nonvolatile memory device may perform a program operation of storing data in a memory cell, a read operation of reading data stored in the memory cell, and an erase operation of erasing stored data, under the control of the memory controller.

In the nonvolatile memory device, the program operation may be performed on a selected memory block among erased memory blocks. A plurality of memory cells are included in the selected memory block, and the distance between the memory cells is gradually narrowed due to an increase in the degree of integration of the memory device. Therefore, memory cells having different threshold voltages may have an electrical influence on each other. For example, when a difference in threshold voltage between adjacent memory cells increases, a retention characteristic of maintaining a threshold voltage may be deteriorated. When the retention characteristic is deteriorated, the reliability of the nonvolatile memory device is lowered. Therefore, improving the reliability of the nonvolatile memory device is needed.

SUMMARY

Embodiments provide a memory controller capable of determining a number of pages to which dummy data is to be programmed according to a threshold voltage level of erased memory cells, and a memory system having the memory controller.

According to an aspect of the present disclosure, there is provided a memory controller including: a central processing unit configured to output a read command for checking an erase state of a selected storage region in response to a program request from a host, determine the number of dummy pages according to the erase state, and output a program command according to the number of dummy pages; and a memory interface configured to, when user data corresponding to the program request is output to the selected storage region, selectively generate dummy data corresponding to the number of dummy pages, and output the dummy data with the user data.

According to another aspect of the present disclosure, there is provided a memory system including: a memory device configured to store data; and a memory controller configured to, when a program request is received from a host, determine the number of dummy pages to which dummy data is to be programmed among unselected pages of a selected storage region among a plurality of storage regions included in the memory device according to an erase state of the selected storage region.

According to still another aspect of the present disclosure, there is provided a memory system including: a memory device configured to store data; and a memory controller configured to, when a program request is received from a host, omit a dummy program operation of unselected pages of a selected memory block among a plurality of memory blocks included in the memory device or perform the dummy program operation on only some pages, according to an erase state of the selected memory block.

According to still another aspect of the present disclosure, there is provided a memory system including: a memory device including a plurality of memory blocks; and a memory controller suitable for: determining a selected memory block among the plurality of memory blocks in response to a program request; determining an erase state of the selected memory block; determining the number of dummy pages based on the determined erase state; and controlling the memory device to program user data into at least one selected page of the selected memory block, and program dummy data corresponding to the number of dummy pages into unselected pages of the selected memory block.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Advantages, features and methods for achieving various embodiments of the present disclosure will become more apparent after a reading of the following embodiments taken in conjunction with the drawings. The present disclosure may, however, be embodied in different forms and should not be construed as being limited to the embodiments set forth herein. Rather, these embodiments are provided to describe the present disclosure in detail to the extent that those skilled in the art to which the disclosure pertains may easily enforce the technical concept of the present disclosure.

It is noted that reference to "an embodiment," "another embodiment" or the like does not necessarily mean only one embodiment, and different references to any such phrase are not necessarily to the same embodiment(s).

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

As used herein, singular forms may include the plural forms as well and vice versa, unless the context clearly indicates otherwise. The articles 'a' and 'an' as used in this application and the appended claims should generally be construed to mean 'one or more' unless specified otherwise or clear from context to be directed to a singular form.

Figure 1:
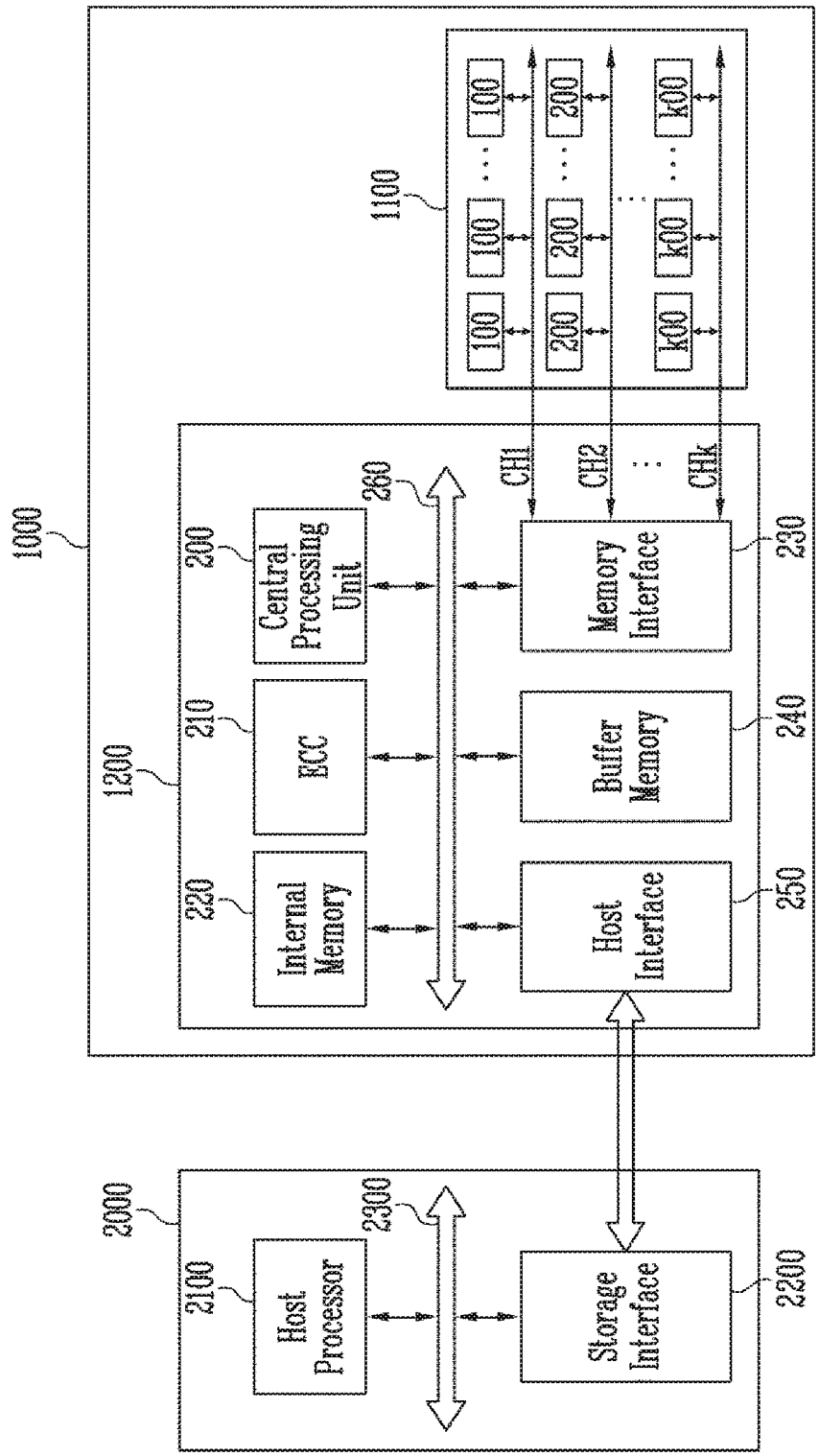
FIG. 1 is a diagram illustrating a memory system according to an embodiment of the present disclosure.

FIG. 1 is a diagram illustrating a memory system 1000 according to an embodiment of the present disclosure.

Referring to FIG. 1, the memory system 1000 may include a storage device 1100 for storing data and a memory controller 1200 for communicating between the storage device 1100 and a host 2000.

The storage device 1100 may include a plurality of memory devices 100, 200, . . . , and k00. For example, the memory devices 100 to k00 may be implemented with a volatile memory device in which stored data is lost when the supply of power is interrupted or a nonvolatile memory device in which store data is retained even when the supply of power is interrupted. FIG. 1 illustrates an embodiment in which the memory devices 100 to k00 are implemented with the nonvolatile memory device. For example, the nonvolatile memory device may be a flash memory device.

The memory devices 100 to k00 may be connected to a plurality of channels CH1 to CHk. For example, the plurality of memory devices 100 to k00 may be connected to the first to kth channels CH1 to CHk, respectively. In other words, a plurality of memory devices 100 may be connected to the first channel CH1, a plurality of memory devices 200 may be connected to the second channel CH2, and a plurality of memory devices k00 may be connected to the kth channel CHk.

The memory controller 1200 may include a central processing unit (CPU) 200, an error correction circuit (ECC) 210, an internal memory 220, a memory interface 230, a buffer memory 240, and a host interface 250. The CPU 200, the ECC 210, the internal memory 220, the memory interface 230, the buffer memory 240, and the host interface 250 may communicate with each other through a bus 260.

The CPU 200 may perform various operations for controlling the storage device 1100, or generate a command and an address for the storage device 1100. For example, the CPU 200 may generate a command in response to a request from the host 2000. In a program operation, the CPU 200 may check an erase state of memory cells included in a selected storage region (e.g., a memory block), and determine the number of pages to which dummy data is to be programmed or pages to which user data is to be programmed according to the checked erase state. For example, when pages to which the dummy data is to be programmed among pages included in the selected memory block are determined, the user data may be programmed to the other pages. Alternatively, when pages to which the user data is to be programmed among the pages included in the selected memory block are determined, the dummy data may be programmed to the other pages. Pages to which the dummy data or the user data is to be programmed may be determined by a row address. In the following embodiment, a method of determining the number of pages to which the dummy data is to be programmed according to the erase state of the selected memory block will be described.

When the erase state of the memory cells included in the selected memory block is deep, the retention characteristic of the memory cells may be deteriorated. Therefore, the CPU 200 may select a large number of addresses of pages to which the dummy data is to be programmed. When the erase state is described as "deep" it means that a threshold voltage of erased memory cells is low within an erase range. When the erase state is described as "shallow" it means that the threshold voltage of the erased memory cells is high within an erase range. When the erase state is described as "middle" it means that the threshold voltage of the erased memory cells is between the deep erase state and the shallow erase state.

In an embodiment, a dummy program operation of programming dummy data to a dummy page may be performed using an Increment Step Pulse Program (ISPP) method. Alternatively, in an embodiment, the dummy program operation may be performed using a method of omitting a verify operation and applying only a dummy program voltage to a word line. For example, the dummy program operation using the ISPP method is a program method of gradually increasing the dummy program voltage, and the verify operation may be performed after the dummy program voltage is applied to the word line. A plurality of program loops may be performed using this method until a threshold voltage of memory cells included in the dummy page reaches a target level. A program loop means a section (a period) in which a program voltage and a verify voltage are applied before a next program voltage is applied to a word line. Alternatively, in the dummy program operation using the ISPP method, when program loops are performed a set number of times even though the threshold voltage of the memory cells does not reach the target level, the dummy program operation of the dummy page may be ended. In addition, in the dummy program operation using the method of omitting the verify operation instead of the ISPP method, when a set number of dummy program voltages are applied to the word line, the dummy program operation of the dummy page may be ended.

The ECC 210 may encode data received from the host 2000 in a program operation, and decode data received from a memory device in a read operation.

The internal memory 220 may store various information necessary for an operation of the memory controller 1200. For example, the internal memory 220 may include address map tables for storing mapping information between logical addresses and physical addresses. The address map tables may be stored in the memory devices 100 to k00. When the memory system 1000 is booted, the address map tables stored in the memory devices 100 to k00 may be re-loaded to the internal memory 220. By way of example and not limitation, the internal memory 220 may be configured with at least one of a Random Access Memory (RAM), a Dynamic RAM (DRAM), a Static RAM (SRAM), a cache, and a Tightly Coupled Memory (TCM).

The memory interface 230 may exchange commands, addresses, data, and the like between the memory controller 1200 and the storage device 1100. For example, the memory interface 230 may transmit commands, addresses, and data to the memory device 100 to k00 through the first to kth channels CH1 to CHk, and receive data from the memory devices 100 to k00.

The buffer memory 240 may be included in the memory controller 1200, or be separately mounted at the outside of the memory controller 1200. When an operation of the memory system 1000 is performed, the buffer memory 240 may temporarily store data necessary for the operation. For example, when in a program operation, original user data may be temporarily stored in the buffer memory 240 until the program operation of a selected memory device passes. In addition, address mapping information necessary for the operation of the memory system 1000 may be stored in the buffer memory 240.

The host interface 250 may exchange commands, addresses, data, and the like between the memory controller 1200 and the host 2000. For example, the host interface 250 may receive a request, an address, and data from the host 2000, and transmit data to the host 2000.

The host 2000 may include a host processor 2100 and a storage interface 2200. The host processor 2100 and the storage interface 2200 may communicate with each other through a bus 2300.

The host processor 2100 may generate a program request for controlling a program operation of the memory system 1000, a read request for controlling a read operation of the memory system 1000, or an erase request for controlling an erase operation of the memory system 1000.

The storage interface 2200 may communicate with the memory system 1000 by using an interface protocol such as a Peripheral Component Interconnect express (PCIe), an Advanced Technology Attachment (ATA), a Serial ATA (SATA), a Parallel ATA (PATA), a Serial Attached SCSI (SAS) or a Non-Volatile Memory express (NVMe). The storage interface 2200 is not limited to the above-described examples, and may include various other interfaces such as a Universal Serial Bus (USB), a Multi-Media Card (MMC), an Enhanced Small Disk Interface (ESDI), and an Integrated Drive Electronics (IDE).

Figure 2:
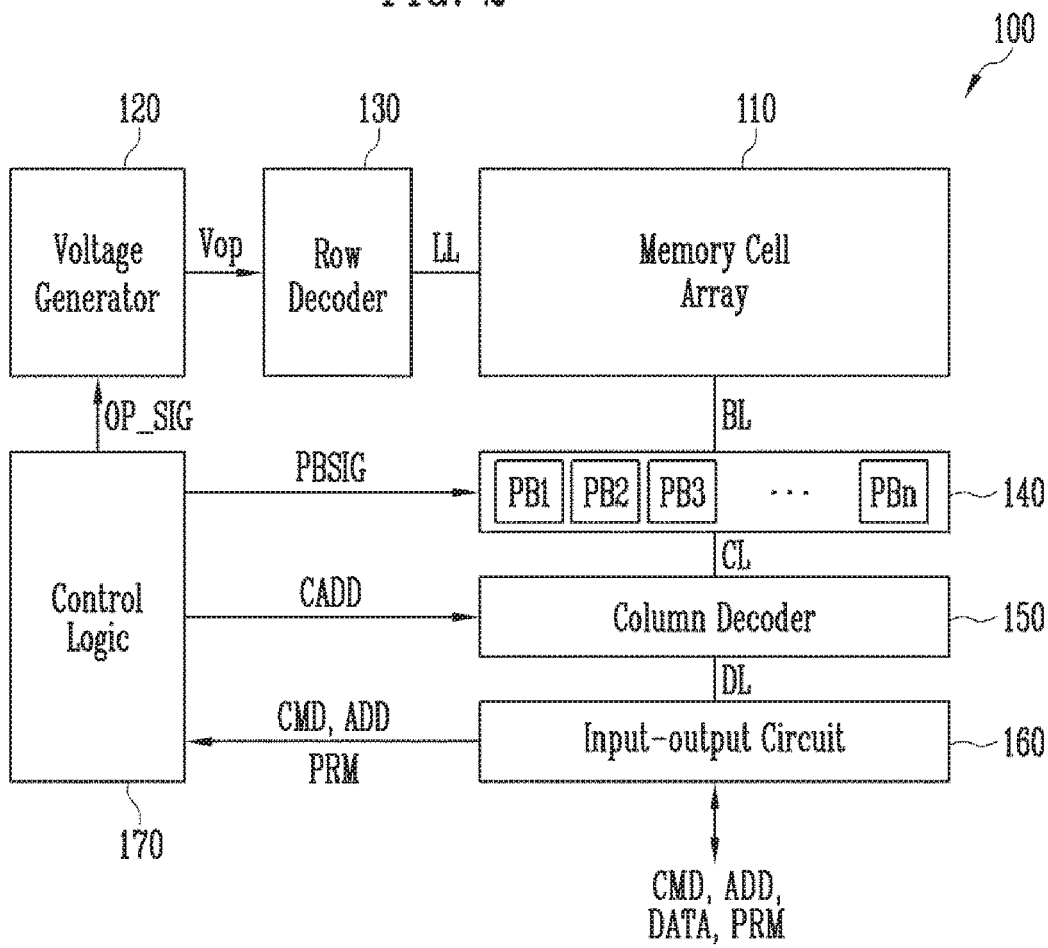
FIG. 2 is a diagram illustrating in detail a memory device according to an embodiment of the present disclosure.

FIG. 2 is a diagram illustrating in detail a memory device (e.g., the memory device 100 of FIG. 1) according to an embodiment of the present disclosure. In FIG. 2, only one memory device 100 is shown as an example, since the configuration of each of the memory devices 100 to k00 are substantially the same.

Referring to FIG. 2, the memory device 100 may include a memory cell array 110, a voltage generator 120, a row decoder 130, a page buffer group 140, a column decoder 150, an input and output (input-output) circuit 160, and a control logic 170.

The memory cell array 110 may include a plurality of memory cells for storing data. For example, the memory cell array 110 may include a plurality of memory blocks, and each of the memory blocks may include a plurality of memory cells.

The voltage generator 120 may generate and output operation voltages Vop necessary for each operation in response to an operation signal OP_SIG provided from the control logic 170. For example, the voltage generator 120 may generate a program voltage, a pass voltage, and a program verify voltage in a program operation, generate a read voltage, and a pass voltage in a read operation, and generate an erase voltage, an erase verify voltage, and a pass voltage in an erase operation.

The row decoder 130 may transfer an operation voltage Vop to local lines LL connected to a selected memory block of the memory cell array 110.

The page buffer group 140 may include a plurality of page buffers PB1 to PBn (where n is a positive integer) connected to the memory cell array 110 through bit lines BL. The page buffers PB1 to PBn may sense voltages or currents of the memory cells through the bit lines BL in response to a page signal PBSIG, and temporarily store the sensed data. The page buffers PB1 to PBn may exchange data with the column decoder 150 through column lines CL.

The column decoder 150 may exchange data with the input-output circuit 160 through data lines DL, and exchange data with the page buffer group 140 through the column lines CL. The column decoder 150 may transmit and receive data in response to a column address CADD.

The input-output circuit 160 may receive a command CMD, an address ADD, data DATA, and parameter information PRM from the memory controller 1200 of FIG. 1, transmit the command CMD, the address ADD, and the parameter information PRM to the control logic 170, and transmit the data DATA to the column decoder 150. The input-output circuit 160 may transmit the data DATA received from the column decoder 150 to the memory controller 1200.

The control logic 170 may control the voltage generator 120, the row decoder 130, the page buffer group 140, the column decoder 150, and the input-output circuit 160 such that a program, read or erase operation is performed in response to the command CMD, the address ADD, and the parameter information PRM. For example, the control logic 170 may output the operation signal OP_SIG, the page signal PBSIG, and the column address CADD in response to the command CMD, the address ADD, and the parameter information PRM.

Figure 3:
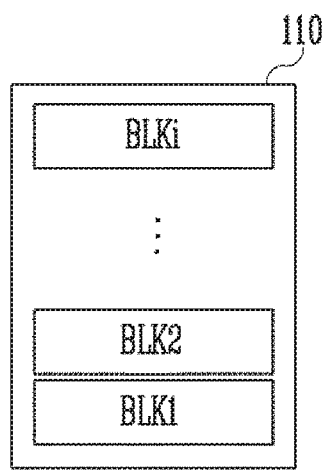
FIG. 3 is a diagram illustrating in detail a memory cell array according to an embodiment of the present disclosure.

FIG. 3 is a diagram illustrating in detail a memory cell array (e.g., the memory cell array 110 of FIG. 2) according to an embodiment of the present disclosure.

Referring to FIG. 3, the memory cell array 110 may include a plurality of memory blocks BLK1 to BLKi. The memory blocks BLK1 to BLKi may share the bit lines BL with one another, but be respectively connected to the local lines LL. That is, different local lines LL may be connected to the respective memory blocks BLK1 to BLKi, and the same bit lines BL may be commonly connected to the memory blocks BLK1 to BLKi.

Figure 4:
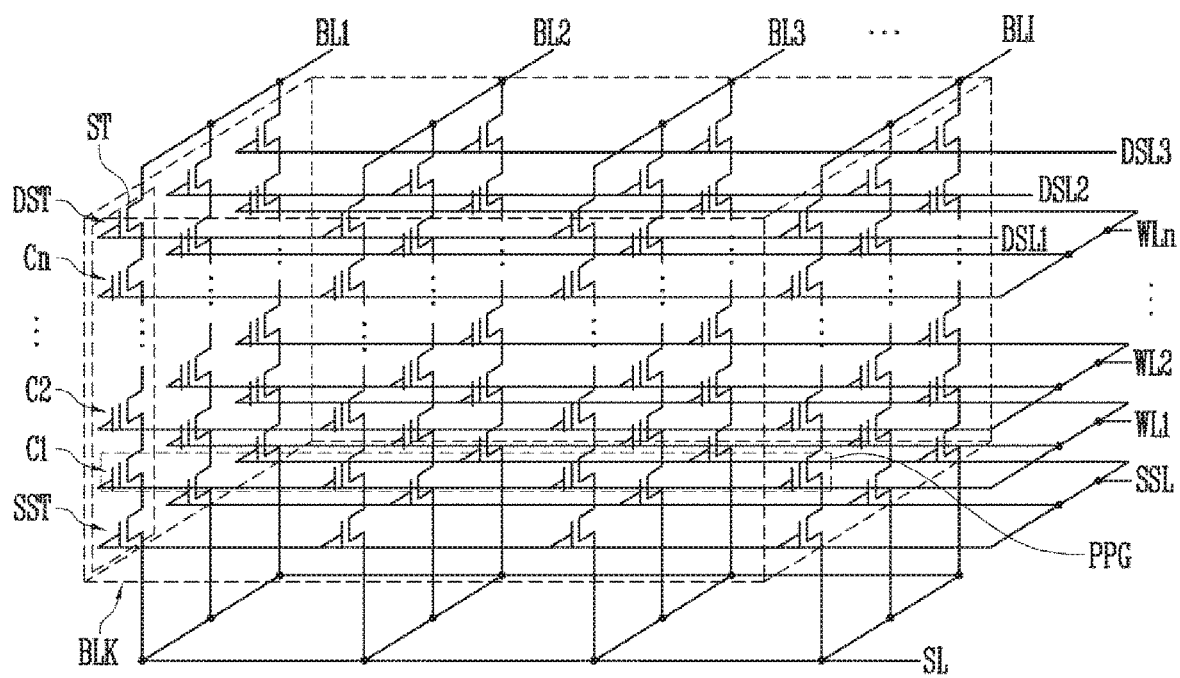
FIG. 4 is a circuit diagram illustrating in detail a memory block according to an embodiment of the present disclosure.

FIG. 4 is a circuit diagram illustrating in detail a memory block BLK according to an embodiment of the present disclosure. The memory block BLK may correspond to any one of the plurality of memory blocks BLK1 to BLKi of FIG. 3.

Referring to FIG. 4, a portion of the memory block BLK formed in a three-dimensional structure is illustrated. The memory block BLK may include a plurality of strings ST. The strings ST may include source select transistors SST, memory cells C1 to Cn (where n is a positive integer), and drain select transistors DST, which are connected between a source line SL and bit lines BL1 to BLI. Although a structure in which the strings ST are commonly connected to one source line SL is illustrated in FIG. 4, a plurality of source lines SL may be connected to one memory block BLK.

Gates of source select transistors SST included in different strings ST may be connected to a source select line SSL, gates of memory cells C1 to Cn included in the different strings ST may be connected to word lines WL1 to WLn, and gates of drain select transistors DST included in the different strings ST may be connected to drain select lines DSL1 to DSL3.

Although a case where one source select line SSL and one drain select line (any one of DSL1 to DSL3) are connected to each of the strings ST is illustrated in FIG. 4, the number of select lines may increase depending on memory devices. In addition, the strings ST may further include dummy cells (not shown) connected to dummy lines (not shown). For example, the dummy cells may be connected between some of the memory cells C1 to Cn, or be connected between the memory cells C1 to Cn and the drain or source select transistors DST or SST.

Figure 5:
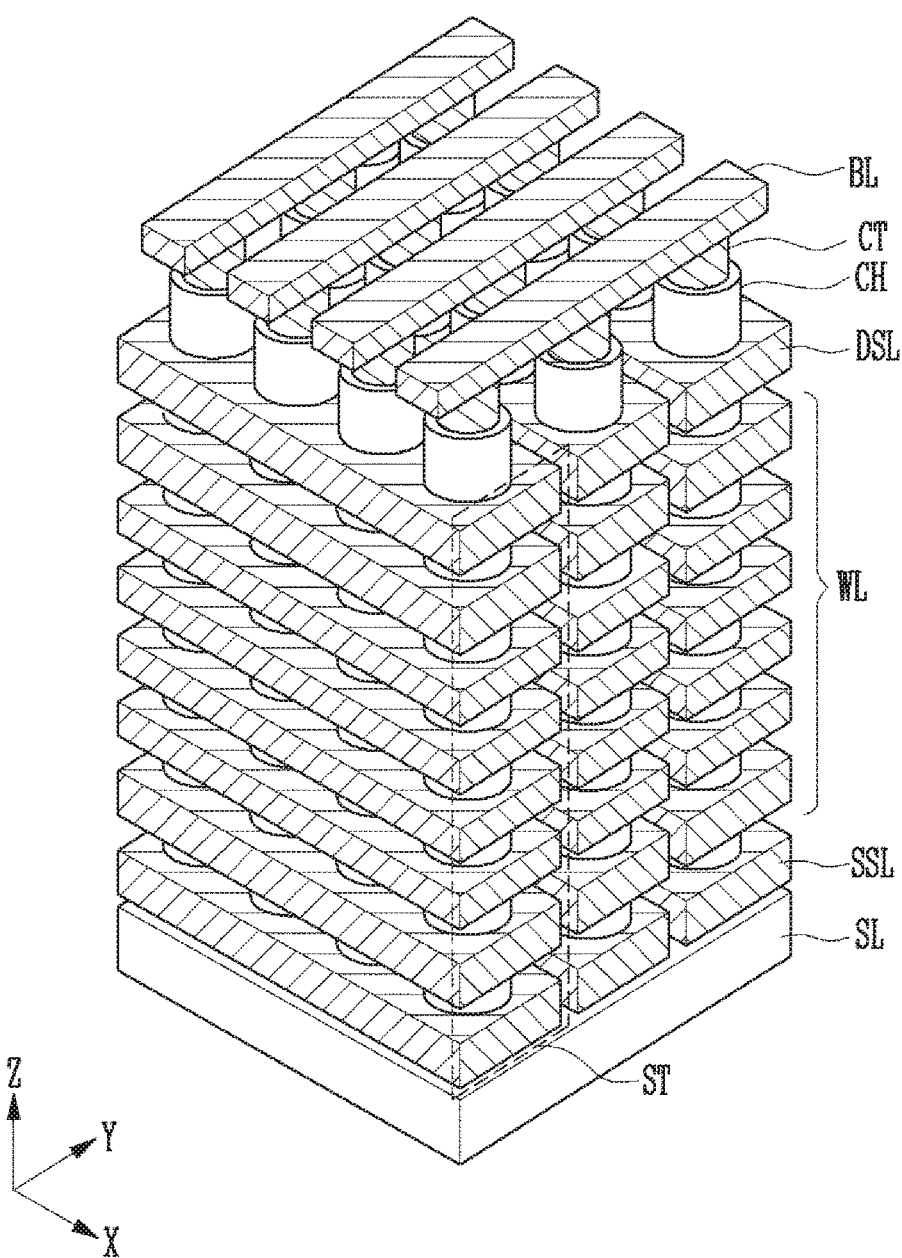
FIG. 5 is a perspective view illustrating in detail a memory block according to an embodiment of the present disclosure.

FIG. 5 is a perspective view illustrating in detail a memory block according to an embodiment of the present disclosure.

In this embodiment, a plurality of source lines are formed in one memory block. In FIG. 5, one source line will be described as an example.

Referring to FIG. 5, a portion of a memory block implemented in a three-dimensional structure is illustrated, and a structure in which a plurality of strings ST are formed on one source line SL is disclosed. The strings ST may be formed in an I shape vertical in a Z direction on a substrate, and be arranged between bits lines BL and the source line SL. This structure is referred to as a Bit Cost Scalable (BiCS) structure. For example, when the source line SL is horizontally formed on the substrate, the strings ST having the BiCS structure may be formed in a vertical direction on the top of the source line SL. More specifically, the strings ST may be arranged in X and Y directions on the source line SL. The strings ST may include source select lines SSL, word lines WL, and drain select lines DSL, which are stacked on the source line SL to be spaced apart from each other. Numbers of the source select lines SSL, the word lines WL, and the drain select lines DSL are not limited to those shown in the drawing, and may be changed depending on memory devices. The strings ST may include vertical channel layers CH vertically penetrating the source select lines SSL, the word lines WL, and the drain select lines DSL. The bit lines BL may be in contact with the tops of the vertical channel layers CH extending to the tops of the drain select lines DSL. The bit lines BL may extend in the Y direction and be arranged in the X direction to be spaced apart from each other. Memory cells may be formed between the word lines and the vertical channel layers CH. A contact plug CT may be further formed between the bit lines BL and the vertical channel layers CH.

Figure 6:
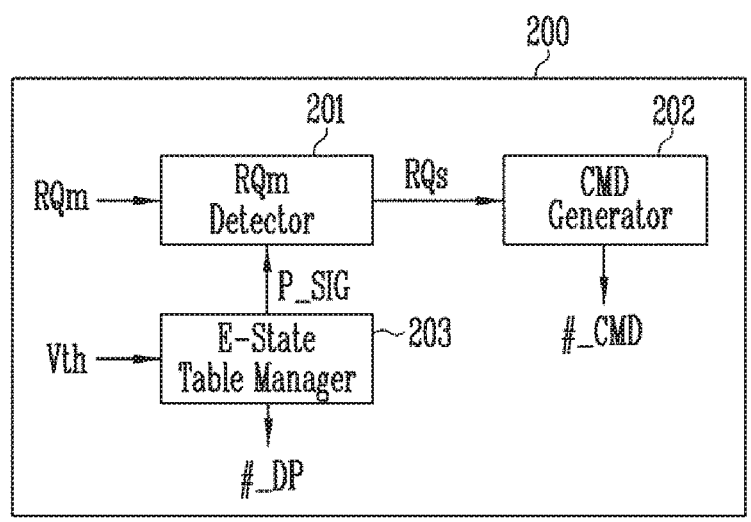
FIG. 6 is a diagram illustrating in detail a central processor unit according to an embodiment of the present disclosure.

FIG. 6 is a diagram illustrating in detail a central processing unit (CPU) according to an embodiment of the present disclosure, for example, the central processing unit 200 of FIG. 1.

Referring to FIG. 6, the CPU 200 may include a received request (RQm) detector 201, a command (CMD) generator 202, and an erase state (E-state) table manager 203.

The RQm detector 201 may receive a main request RQm from a host (e.g., the host 2000 of FIG. 1). The RQm detector 201 may convert the main request RQm into a sub-request RQs used in the memory controller 1200 and then output the sub-request RQs. For example, when the main request RQm is a request for a read or erase operation, the RQm detector 201 may convert the main request RQm into a read or erase sub-request RQs to be used in the memory controller 1200, and output the sub-request RQs. When the main request RQm is a request for a program operation, the RQm detector 201 does not output a sub-request RQs for programming, but may firstly output a sub-request RQs for a read request. Then, when a program signal P_SIG is received from the E-state table manager 203, the RQm detector 201 may output the sub-request RQs for programming.

More specifically, in an embodiment, when a main request RQm for a program operation is received, an erase state of a selected memory block may be firstly detected before the program operation of the selected memory block is performed. A threshold voltage of memory cells included in the selected memory block may be preferentially checked so as to detect the erase state of the selected memory block, and therefore, the RQm detector 201 outputs a sub-request RQs for reading instead of programming. When the program signal P_SIG is received from the E-state table manager 203, the RQm detector 201 may output a sub-request RQs for programming in response to the program signal P_SIG.

The CMD generator 202 may output a command #_CMD for controlling the storage device 1100 of FIG. 1 in response to the sub-request RQs. For example, the CMD generator 202 may output a program command #_CMD in response to a sub-request RQs for programming, output a read command #_CMD in response to a sub-request RQs for reading, and output an erase command #_CMD in response to a sub-request RQs for erasing.

The E-state table manager 203 may receive threshold voltage information Vth of the selected memory block, and output a dummy page number #_DP corresponding to the threshold voltage information Vth and the program signal P_SIG. For example, before the program operation of the selected memory block is performed, a read operation for checking the erase state of the selected memory block may be performed. Resultant information by the read operation may include threshold voltage information Vth of some memory blocks included in the selected memory block. When threshold voltage information Vth is received, the E-state table manager 203 may output the program signal P_SIG to the RQm detector 201, and output a dummy page number #_DP corresponding to the received threshold voltage information Vth. To this end, the E-state table manager 203 may include registers in which a table is stored and updated, and a circuit for updating data of the registers and outputting the program signal P_SIG.

In an embodiment, the dummy page number #_DP is output according to the threshold voltage information Vth. In another embodiment, user page number information may be output. That is, in the program operation, pages included in the selected memory block may all be set as user pages. Alternatively, some of the pages included in the selected memory block may be set as a dummy page, and the other pages may all be set as user pages. Thus, when a dummy page number is determined, the other pages are all set as user pages, and therefore, information output from the E-state table manager 203 may be changed depending on a setting of the memory controller 1200. As described above, the embodiment of a case where the dummy page number #_DP is output from the E-state table manager 203 will be described.

Figure 7:
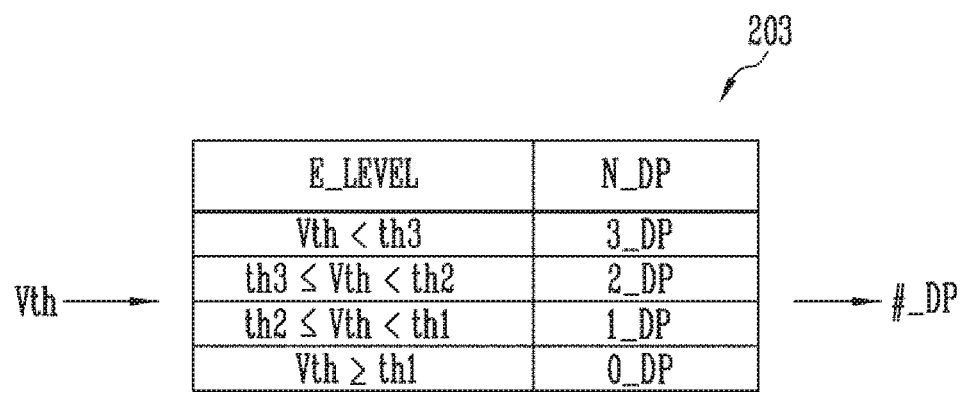
FIG. 7 is a diagram illustrating information stored in an erase state table manager according to an embodiment of the present disclosure.
Figure 8:
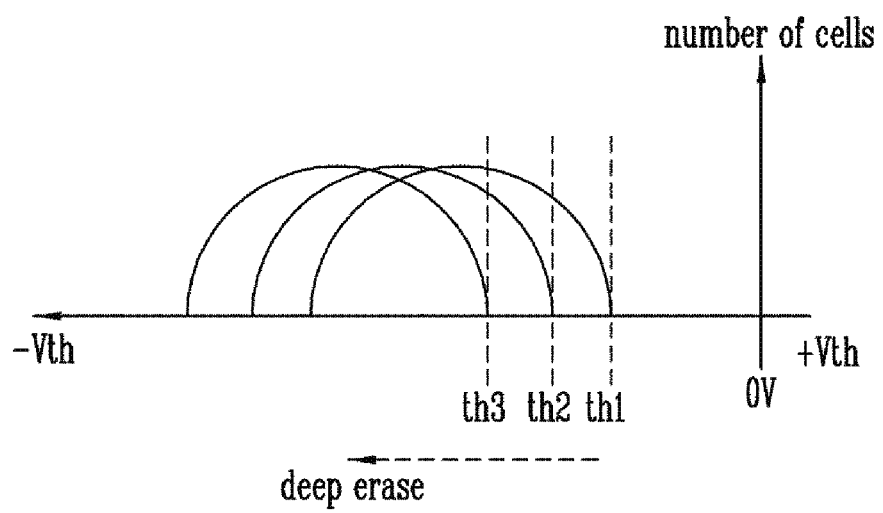
FIG. 8 is a diagram illustrating a threshold voltage level of erased memory cells.

FIG. 7 is a diagram illustrating information stored in an E-state table manager (e.g., the E-state table manager 203 of FIG. 6) according to an embodiment of the present disclosure. FIG. 8 is a diagram illustrating a threshold voltage level of erased memory cells.

Referring to FIGS. 7 and 8, various erase level ranges E_LEVEL and dummy page numbers N_DP corresponding to each range may be included in the E-state table manager 203.

The erase level ranges E_LEVEL correspond to ranges obtained by dividing a threshold voltage (Vth) of erased memory cells into various reference voltages. For example, a threshold voltage of an erase state may be divided into first to third reference voltages th1 to th3. It is assumed that, among the first to third reference voltages th1 to th3, the first reference voltage th1 is highest, the second reference voltage th2 is less than the first reference voltage th1, and the third reference voltage th3 is less than the second reference voltage th2. It is to be noted that the first to third reference voltages th1 to th3 are merely examples, and the threshold voltage may be divided into a larger number of ranges in different embodiments of the present disclosure, using reference voltages of which number is greater than that of the reference voltages th1 to th3 shown in FIG. 7.

Referring to FIG. 8, it may be defined that the erase state is shallow (i.e., shallow erase) when the threshold voltage of the erased memory cells increases (+Vth), and is deep (i.e., deep erase) when the threshold voltage of the erased memory cells decreases (−Vth). For example, all the first to third reference voltages th1 to th3 may be voltages less than 0V. Since the first reference voltage th1 is highest among the first to third reference voltages th1 to th3, the first reference voltage th1 may be a voltage having a smallest difference with 0V, and the third reference voltage th3 may be a voltage having a largest difference with 0V.

The first to third reference voltages th1 to th3 may be used as read voltages in a read operation for checking an erase state of a selected memory block. For example, in a read operation of a selected page, the first reference voltage th1 may be used as a first read voltage. When all memory cells are determined as ON cells as a result of the read operation using the first read voltage th1, the memory cells of the selected memory block are in a state in which they are erased to a level lower than that of the first reference voltage th1. Therefore, when read memory cells are all determined as ON cells, the read operation of the selected page may be performed by using the second reference voltage th2, which is lower than the first reference voltage th1, as a read voltage. When an OFF cell is detected based on data read from the selected page, it may be determined that a threshold voltage of the memory cells of the selected page are distributed between the first reference voltage th1 and the second reference voltage th2. That is, the erase state may be determined using a range including a voltage at which the OFF cell is detected.

Referring to FIGS. 7 and 8, when the first to third reference voltages th1 to th3 are set, the threshold voltage may be divided into a range in which the threshold voltage is greater than or equal to the first reference voltage th1, a range in which the threshold voltage is less than the first reference voltage th1 and is greater than or equal to the second reference voltage th2, a range in which the threshold voltage is less than the second reference voltage th2 and is greater than or equal to the third reference voltage th3, and a range in which the threshold voltage is less than the third reference voltage th3. In addition, different dummy page numbers N_DP may be matched to the respective ranges.

For example, when the threshold voltage of the erased memory cells is included in a range (Vth≥th1) in which the threshold voltage greater than or equal to the first reference voltage th1, the difference in threshold voltage between programmed memory cells and the erased memory cells is smallest, and therefore, the probability that the retention characteristic of the erased memory cells will be deteriorated is also lowest. When the threshold voltage is in this range (Vth≥th1), it is unnecessary to program dummy data in the selected memory block, and thus a dummy page number 0 (0_DP) may correspond to the range (Vth≥th1). That is, when the erase level of the erased memory cells in the selected memory block is shallow (Vth≥th1), all unselected pages in the selected memory block may maintain the erase state. For example, in the case of an open block in which user data is stored in only some pages in the selected memory block, pages included in a region in which the user data is not stored may all maintain the erase state. Accordingly, a dummy program operation of programming dummy data to unselected pages is omitted, and thus a program operation time of the selected memory block may be reduced.

When the threshold voltage of the erased memory cells is included in a range (Vth<th3) in which the threshold voltage is less than the third reference voltage th3, the difference in threshold voltage between programmed memory cells and the erased memory cells is largest, and therefore, the probability that the retention characteristic of the erased memory cells will be deteriorated is also highest. When the threshold voltage is in this range (Vth<th3), dummy data is considerably programmed in the selected memory block, to prevent deterioration of a retention characteristic of memory cells in which user data is stored. In the case of an open block in which user data is stored in only some pages in the selected memory block, dummy data may be programmed to only some pages among the pages included in the region in which the user data is not stored. Accordingly, the number of dummy pages among the unselected pages may increase when the threshold voltage of the erased memory cells decreases. In this embodiment, a dummy page number 3 (3_DP) may correspond to a range (Vth<th3) in which the threshold voltage is less than the third reference voltage th3.

Accordingly, the E-state table manager 203 may be set such that the number of dummy pages is changed depending on a range including the threshold voltage of the erased memory cells among the first reference voltage th1, the second reference voltage th2, and the third reference voltage th3.

As described above, a selected dummy page number #_DP among zeroth to third dummy page numbers 0_DP to 3_DP may be output according to the threshold voltage information Vth of the selected memory block.

In FIGS. 7 and 8, by way of example, three reference voltages have been introduced, four threshold voltage ranges are set, and a dummy page number corresponds to each range. Therefore, the number of ranges obtained by dividing an erase depth of the memory cells included in the selected memory block and the number of dummy pages corresponding to each range are not limited to the above-described numbers.

Figure 9:
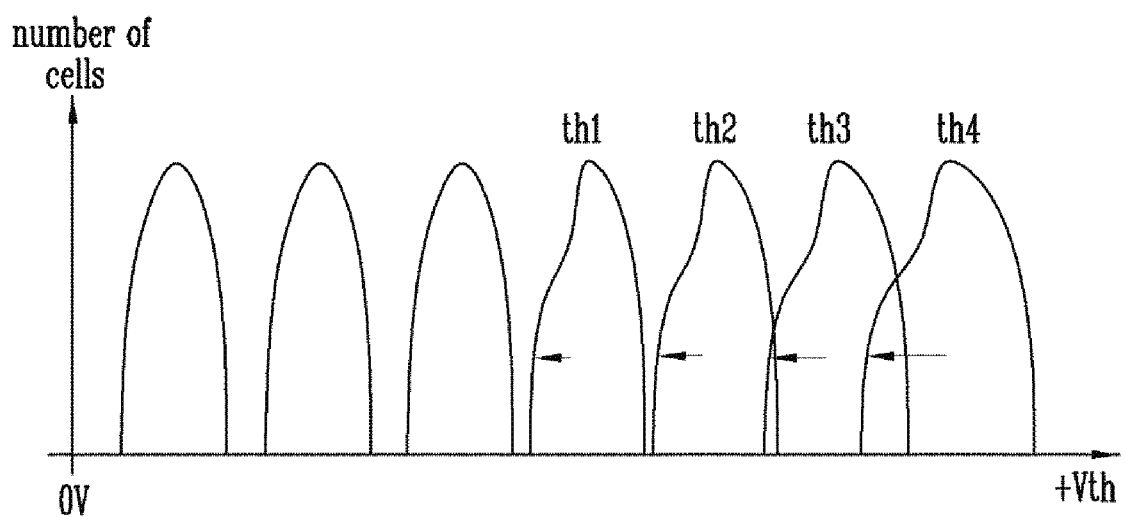
FIG. 9 is a diagram illustrating a change in threshold voltage depending on an erase state of memory cells.

FIG. 9 is a diagram illustrating a change in threshold voltage depending on an erase state of memory cells.

Referring to FIG. 9, a program operation using a Triple Level Cell (TLC) method in which one memory cell can store eight data according to a threshold voltage will be described as an example. Memory cells using the TLC method may be divided into one erase state and seven program states. FIG. 9 illustrates a threshold voltage distribution in a program state. As shown in FIG. 9, a variation in threshold voltage may increase when a threshold voltage of erased memory cells decreases. For example, when the threshold voltage is distributed at the level of the first reference voltage th1, interference between programmed memory cells and the erased memory cells is low, and therefore, a variation in threshold voltage of the programmed memory cells is small. However, when the threshold voltage is distributed at the level of the fourth reference voltage th4, a retention characteristic of the programmed memory cells may be deteriorated, and therefore, the variation in threshold voltage may become large.

Figure 10:
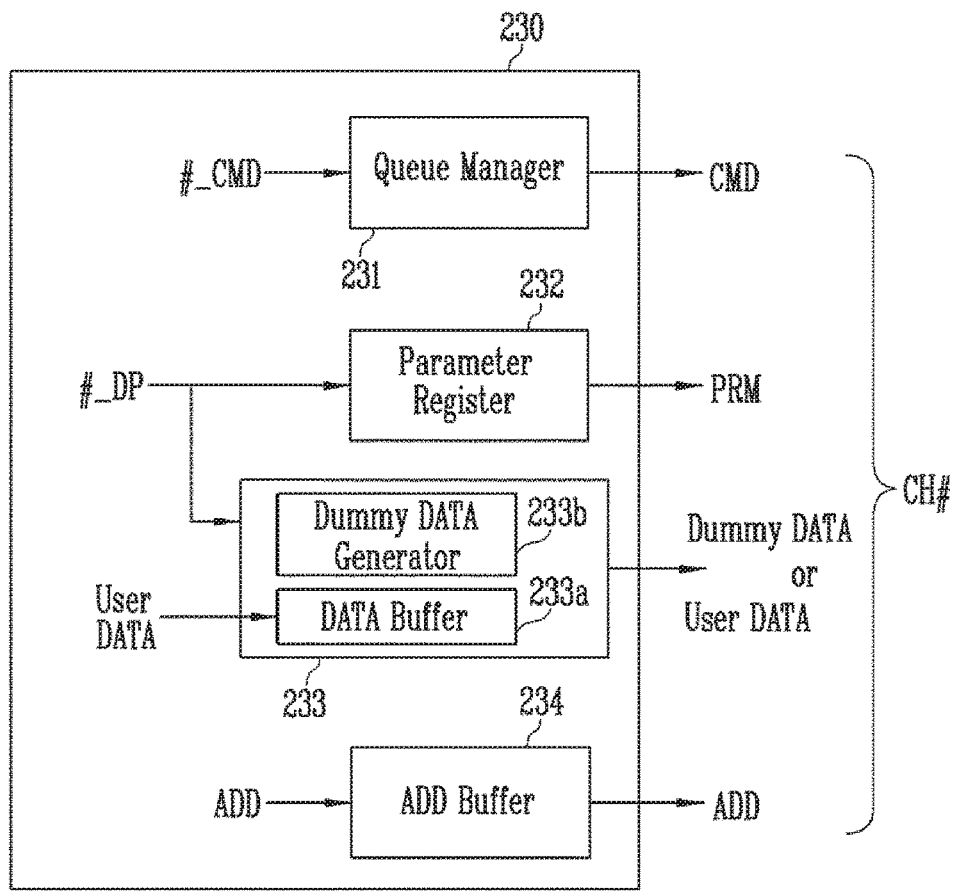
FIG. 10 is a diagram illustrating in detail a memory interface according to an embodiment of the present disclosure.

FIG. 10 is a diagram illustrating in detail a memory interface according to an embodiment of the present disclosure, for example, the memory interface 230 of FIG. 1.

Referring to FIG. 10, the memory interface 230 may output a command CMD, parameter information PRM, and an address ADD in response to a command #_CMD, a dummy page number #_DP, and an address ADD, which are output from the central processing unit 200 of FIG. 6. Also, when user data for program User DATA is input, the memory interface 230 may temporarily store the input user data User DATA and then output the user data User DATA. The memory interface 230 may selectively output dummy data Dummy DATA to be programmed to dummy pages. For example, when the dummy page number #_DP is '0,' the memory interface 230 does not generate the dummy data Dummy DATA but may output only the User data User DATA. Alternatively, when the dummy page number #_DP is '1,' the memory interface 230 may generate dummy data Dummy DATA to be programmed to one dummy page and output the generated dummy data Dummy DATA to a channel CH #.

The memory interface 230 according to this embodiment will be described in detail as follows.

The memory interface 230 may include a command (CMD) queue manager 231, a parameter register 232, a data manager 233, and an address (ADD) buffer 234.

The CMD queue manager 231 may receive commands #_CMD from the central processing unit 200, queue the received commands #_CMD, and then sequentially output a command CMD to the channel CH # according to a queuing sequence.

The parameter register 232 may store values including voltages, and times, which are set to perform program, read, and erase operations, and output parameter information PRM including information of setting values suitable for each operation to the channel CH #. In a normally performed read or erase operation, the parameter register 232 may output information including an initial read voltage, and a sensing time to the channel CH #. However, in the program operation of this embodiment, information of various setting values including a program start voltage for the program operation may be output according to the dummy page number #_DP. For example, parameter information PRM including information of setting values including a program start voltage, and a program pass voltage according to a number of dummy pages may be output.

The data manager 233 may include a data buffer 233a and a dummy data generator 233b. The data buffer 233a may temporarily store received user data User DATA and then output the user data User DATA to the channel CH #. The dummy data generator 233b may generate dummy data Dummy DATA according to a dummy page number #_DP and output the dummy data Dummy DATA to the channel CH #. For example, when the number of dummy pages is one, the dummy data generator 233b may generate dummy data Dummy DATA having a capacity corresponding to one page. When the number of dummy pages is three, the dummy data generator 233b may generate dummy data Dummy DATA having a capacity corresponding to three pages. When there is no dummy page, the data manager 233 may output only user data User DATA. When the number of dummy pages is one, the data manager 233 may output user data User DATA and dummy data Dummy DATA that may be stored in one page. The dummy data Dummy DATA may be configured with random data. For example, the dummy data Dummy DATA may be generated such that rates of different threshold voltage distributions are equal to each other. For example, the dummy data Dummy DATA may be configured with random data where the number of data with an erase state and the number of first to Nth data with a program state are equal to each other. Various known methods may be used as a method for generating random data in different statuses, and therefore, a detailed description thereof will be omitted in this embodiment.

The ADD buffer 234 may output addresses ADD of pages in which the user data User DATA is to be stored and addresses ADD of dummy pages in which the dummy data Dummy DATA is to be stored. For example, when a read request is received from the host 2000 of FIG. 1, a logical address is received from the host 2000, and therefore, the ADD buffer 234 may output a physical address corresponding to the logical address. The physical address corresponding to the logical address may refer to information stored in the buffer memory 240 of FIG. 1. When an operation in which no logical address is received from the host 2000 is performed, the ADD buffer 234 may output a physical address of a preset storage region. For example, in a read operation of checking an erase state of a selected memory block, the read operation of any one page is performed, and therefore, the ADD buffer 234 may output a physical address of a preset page. Also, in a program operation, the ADD buffer 234 may output a preset physical address. The preset physical address may be a physical address of a first page of the program operation, be a physical address of a last page of the program operation, or be randomly selected regardless of an order of the program operation.

Figure 11:
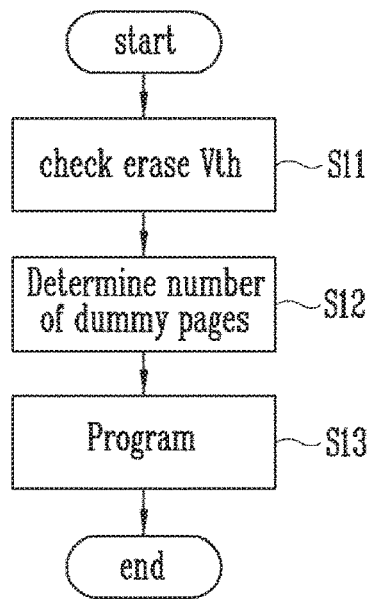
FIG. 11 is a flowchart illustrating an operating method according to an embodiment of the present disclosure.

FIG. 11 is a flowchart illustrating an operating method according to an embodiment of the present disclosure. The operating method of FIG. 11 may be performed between the host 2000 and the memory system including the storage device 1100 and the memory controller 1200, as shown in FIG. 11.

Referring to FIG. 11, when a program request along with user data is received from the host, the memory controller may check an erase state of a selected memory block (S11). For example, when the program request is received from the host, the central processing unit of the memory controller may output a read command for checking the erase state of the selected memory block together with an address of the selected memory block.

The erase state of the selected memory block may be determined based on a result obtained by reading some pages included in the selected memory block. For example, a read operation on any one page included in the selected memory block may be performed, and the central processing unit may determine whether the erase state is deep or shallow according to read data.

The central processing unit may determine the number of dummy pages according to the erase state of the selected memory block (S12). For example, the central processing unit may increase the number of dummy pages when the erase state of the selected memory block becomes deeper. On the contrary, the central processing unit may decrease the number of dummy pages or select no dummy page when the erase state of the selected memory block becomes shallower.

When the number of dummy pages is determined, the central processing unit may perform a program operation of the selected memory block by outputting a program command (S13). For example, the central processing unit may control the storage device such that the user data is stored in selected pages of the selected memory block, and control the storage device such that dummy data is programmed to dummy pages among the unselected pages of the selected memory block.

Figure 12:
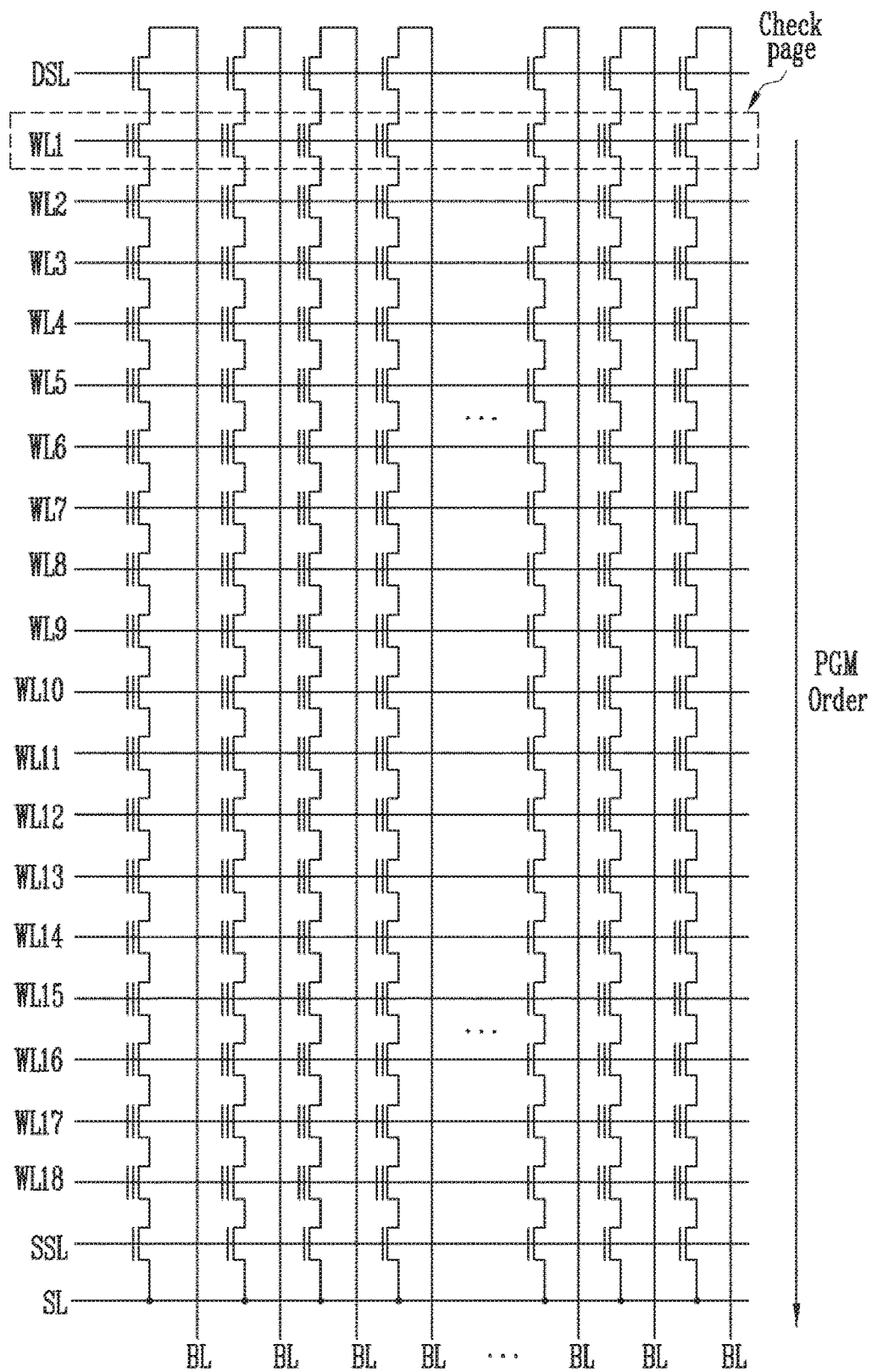
FIG. 12 is a diagram illustrating an operation of checking an erase state of memory cells according to an embodiment of the present disclosure.

FIG. 12 is a diagram illustrating an operation of checking an erase state of memory cells according to an embodiment of the present disclosure. The operation of FIG. 12 corresponds to an example of the step S11 shown in FIG. 11.

Referring to FIG. 12, the erase state of the selected memory block may be checked by reading at least one page included in the selected memory block. A method for reading at least one page is diverse, and an embodiment of a method for reading one page from the selected memory block is illustrated in FIG. 12.

Since all memory cells of the selected memory block have been erased before the program operation is performed, that a selected page is read means that erased memory cells are read.

A program order PGM Order in which the program operation is performed may be changed depending on an algorithm set in a memory device. In FIG. 12, an embodiment in which the program operation is set to be performed in the direction from the drain select line DSL to the source select line SSL will be described.

A check page Check page selected to check the erase state of the selected memory block may be a first page on which the program operation is to be performed. Therefore, in FIG. 12, a page connected to a first word line WL1 may be selected as the check page Check page. That is, the erase state of the selected memory block may be determined based on data read from the check page Check page. When the selected memory block is formed in the three-dimensional structure (see FIG. 4), the check page Check page may be a page located at an uppermost end.

Figure 13:
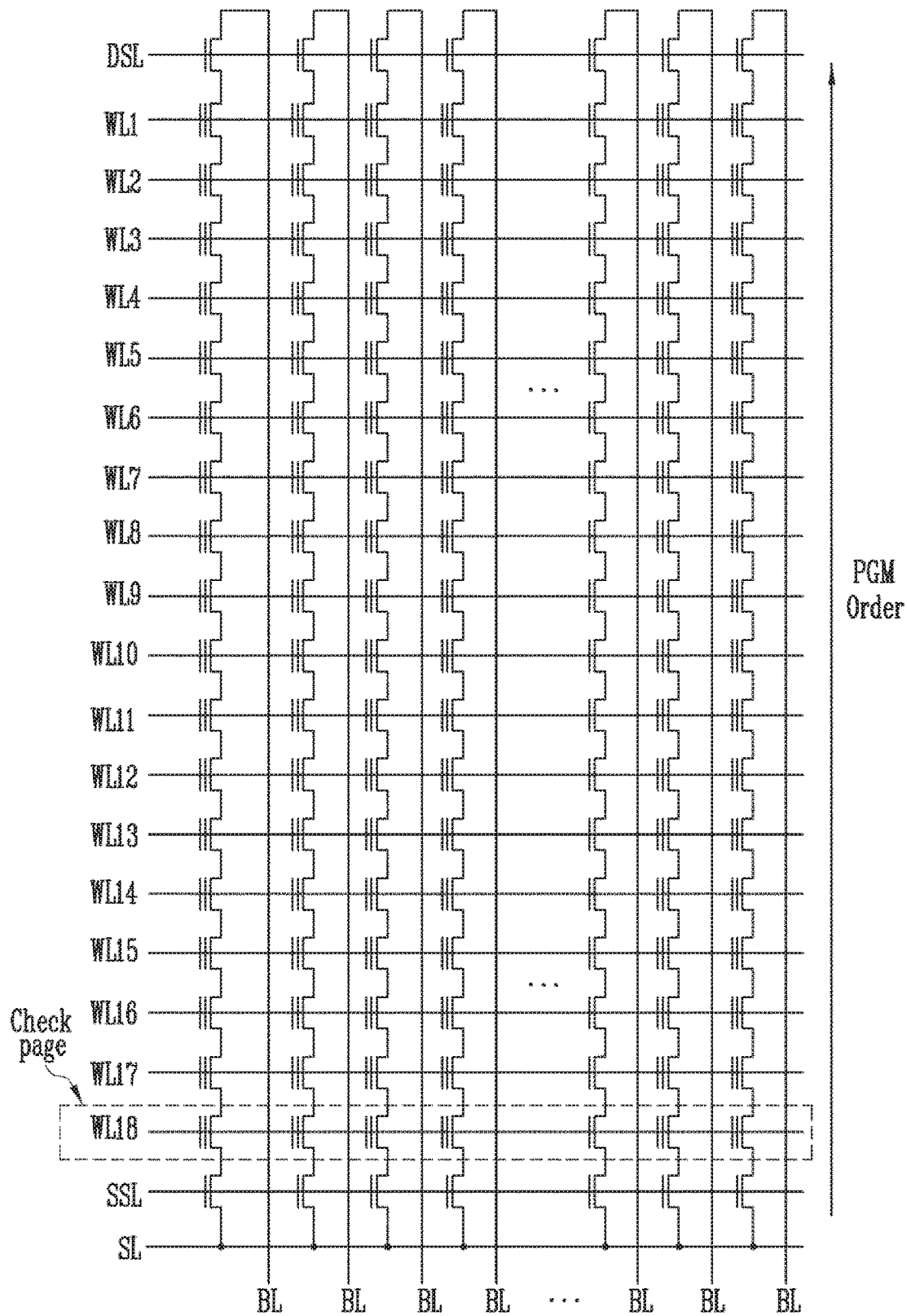
FIG. 13 is a diagram illustrating an operation of checking an erase state of memory cells according to an embodiment of the present disclosure.

FIG. 13 is a diagram illustrating an operation of checking an erase state of memory cells according to an embodiment of the present disclosure. The operation of FIG. 13 corresponds to an example of the step S11 shown in FIG. 11.

In FIG. 13, an embodiment set such that the program operation is performed in the direction from the source select line SSL to the drain select line DSL will be described.

A check page Check page selected to check the erase state of the selected memory block may be a first page on which the program operation is to be performed. Therefore, in FIG. 13, a page connected to an eighteenth word line WL18 may be selected as the check page Check page. That is, the erase state of the selected memory block may be determined based on data read from the check page Check page. When the selected memory block is formed in the three-dimensional structure (see FIG. 4), the check page Check page may be a page located at a lowermost end.

Figure 14:
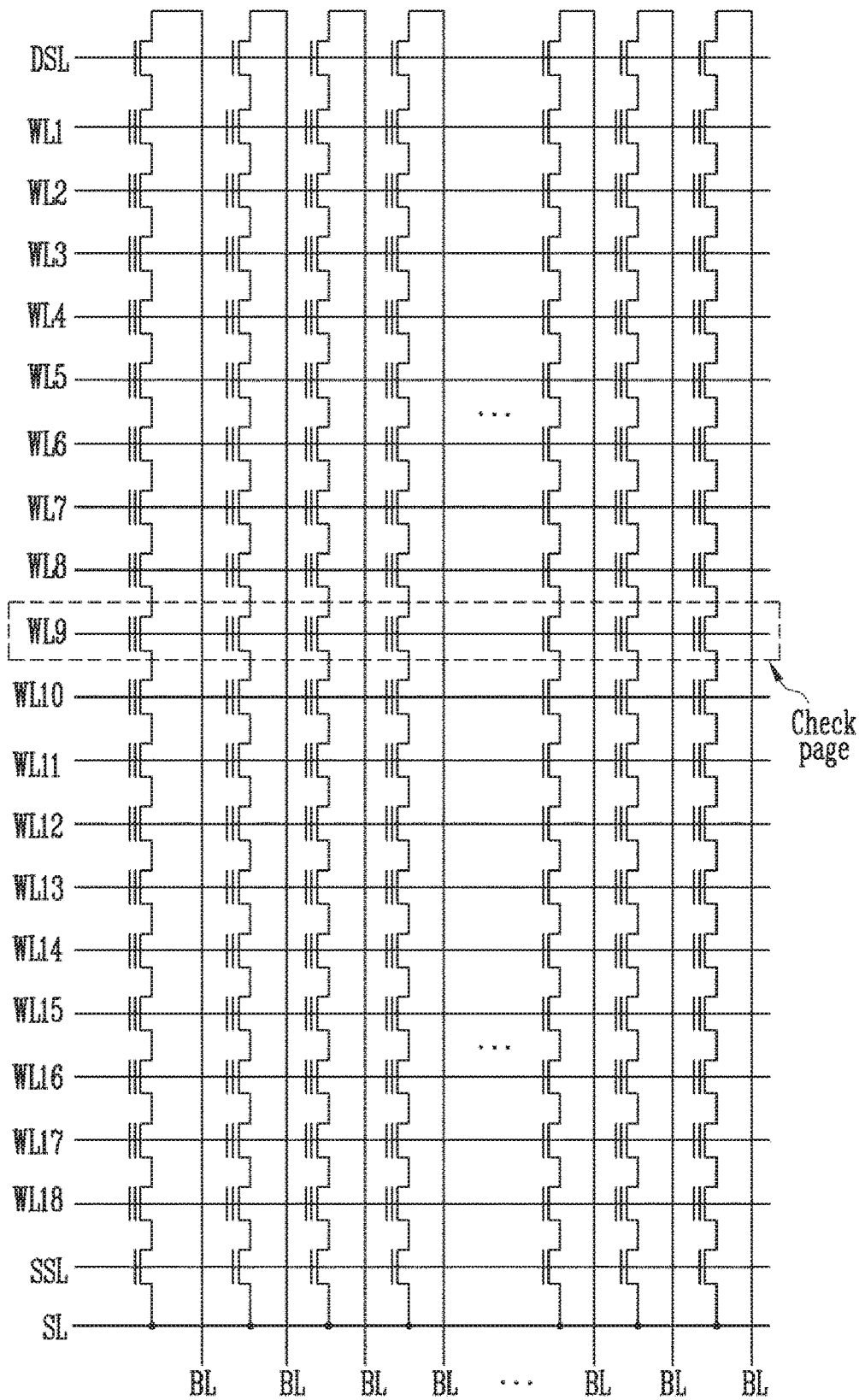
FIG. 14 is a diagram illustrating an operation of checking an erase state of memory cells according to an embodiment of the present disclosure.

FIG. 14 is a diagram illustrating an operation of checking an erase state of memory cells according to an embodiment of the present disclosure. The operation of FIG. 14 corresponds to an example of the step S11 shown in FIG. 11.

Referring to FIG. 14, a check page Check page selected to check the erase state of the selected memory block may be selected regardless of an order of the program operation. For example, a page located in the middle among a plurality of pages included in the selected memory block may be used as the check page Check page. For example, a page connected to a ninth word line WL9 may be used as the check page Check page.

In addition, the check page Check page may be randomly selected among the pages included in the selected memory block.

According to the embodiments described in FIGS. 12 to 14, when a read operation on the selected page is performed, the erase state of the selected memory block may be determined based on read data.

Figure 15:
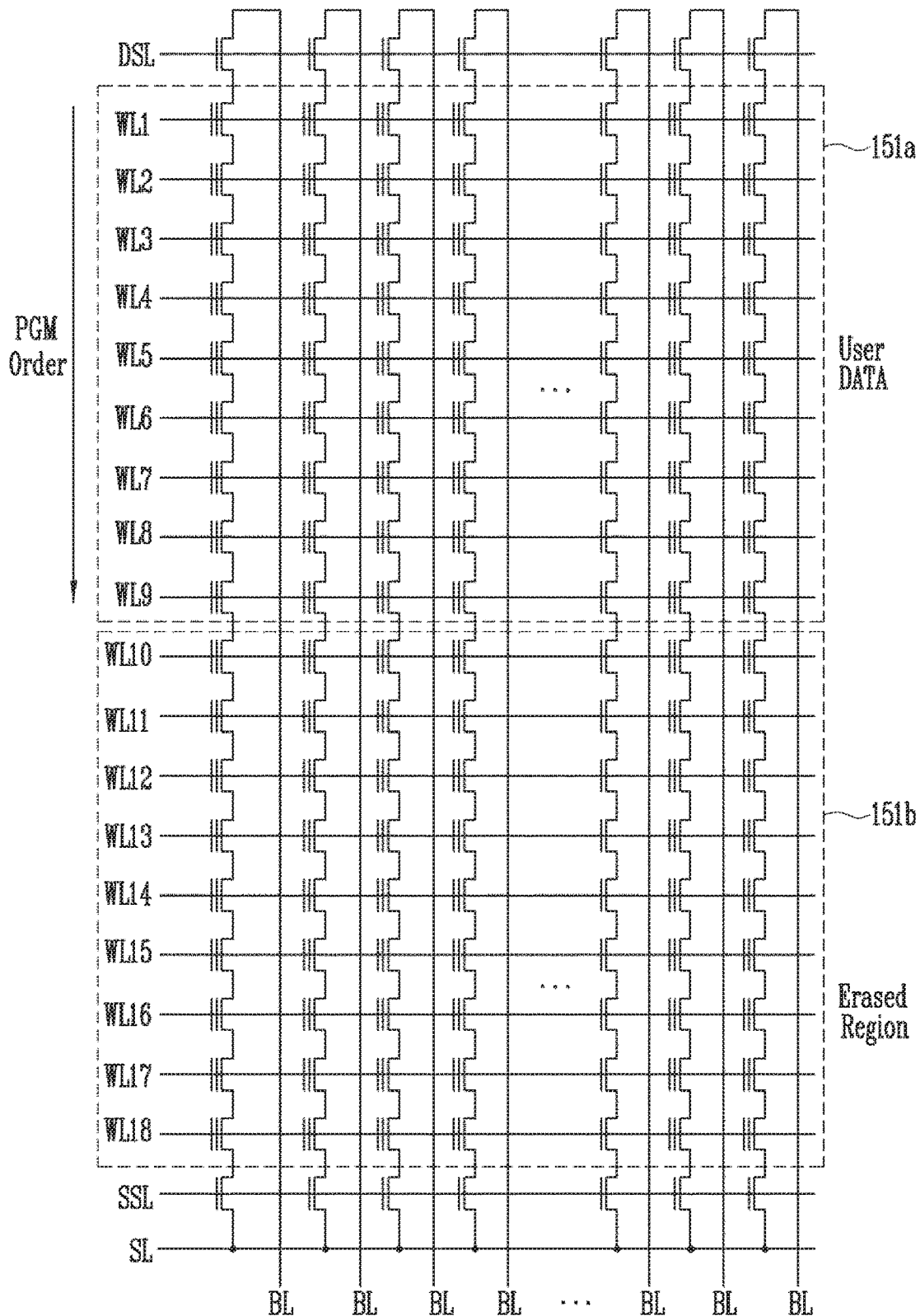
FIG. 15 is a diagram illustrating a program operation when an erase state of memory cells has a shallow level, according to an embodiment of the present disclosure.

FIG. 15 is a diagram illustrating a program operation when an erase state of memory cells has a shallow level, according to an embodiment of the present disclosure. The operation of FIG. 15 corresponds to an example of the step S13 shown in FIG. 11.

Referring to FIG. 15, when the erase state of the selected memory block is shallow (Vth≥th1), programmed memory cells are hardly influenced by erased memory cells, and therefore, no dummy page may be selected. For example, in an open block in which the program operation is performed on only some pages of the selected memory block, unselected pages that are not programmed maintain the erase state. When the erase state of the memory cells that maintain the erase state is shallow, the memory cells are hardly influenced by a threshold voltage of the erased memory cells, and therefore, an operation of programming dummy data to the unselected pages may be omitted. For example, FIG. 15 may correspond to a case where the dummy page number #_DP is output as '0' (0_DP) in the table shown in FIG. 7.

As described above, a program order PGM Order in which the program operation is performed may be diverse, and an embodiment of the program operation performed in the direction from the drain select line DSL to the source select line SSL is illustrated in FIG. 15. When the selected memory block is a three-dimensional memory block, the program operation may be performed on pages from a page located at an uppermost end. In the program operation of the open block, user data User DATA may be stored in selected pages 151a, and unselected pages 151b may maintain the erase state. That is, a region in which the unselected pages 151b are included may be an erased region. For example, when the program operation is performed on pages connected from the first word line WL1 to the ninth word line WL9, the pages are programmed up to the page connected to the ninth word line WL9. Then, the program operation may be ended without programming dummy data to the pages included in the erased region.

As described above, the program operation of dummy data is omitted, so that the time required to perform the program operation of the open block may be reduced.

Figure 16:
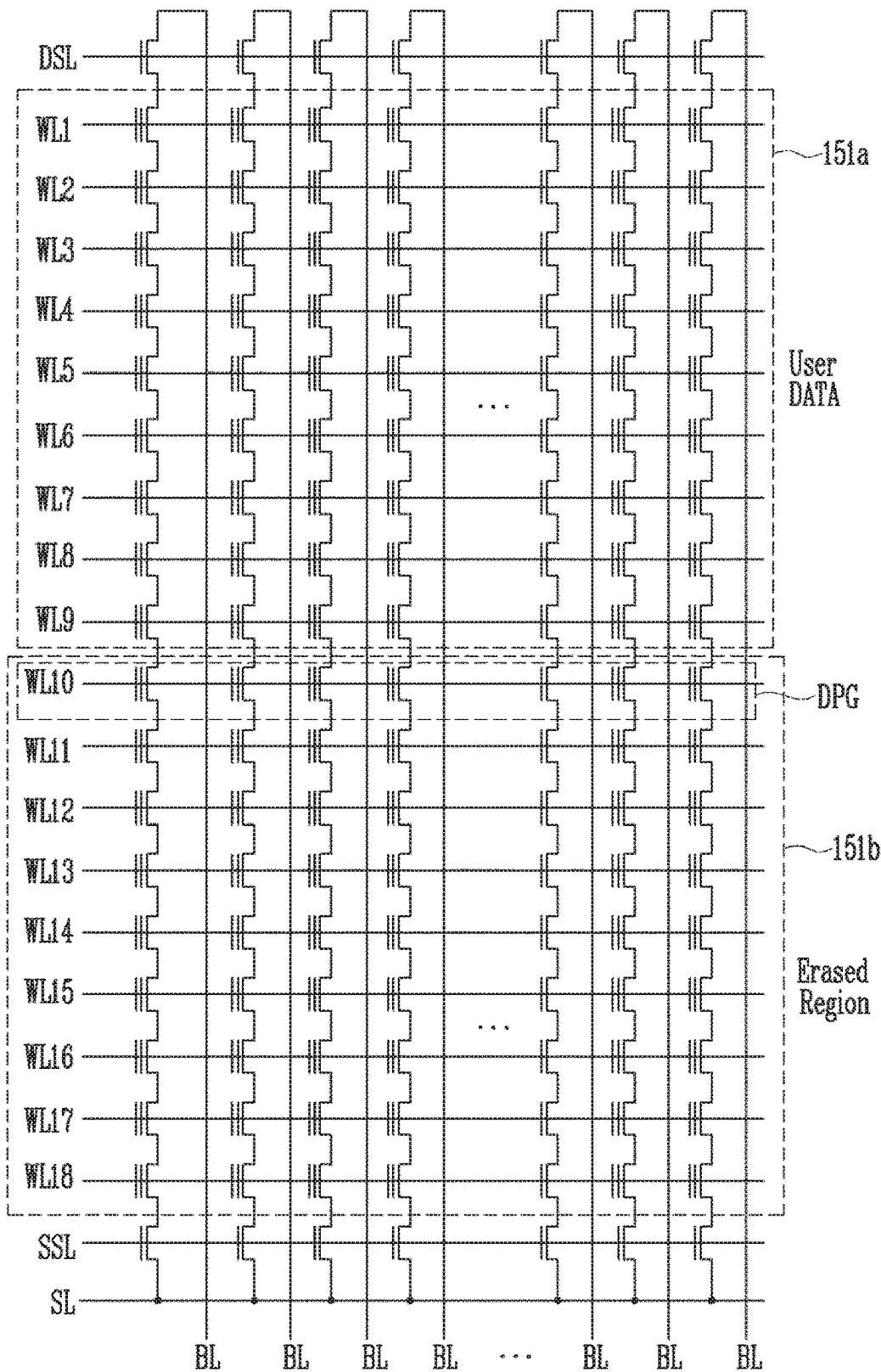
FIGS. 16 and 17 are diagrams illustrating a program operation when an erase state of memory cells has an intermediate level, according to an embodiment of the present disclosure.
Figure 17:
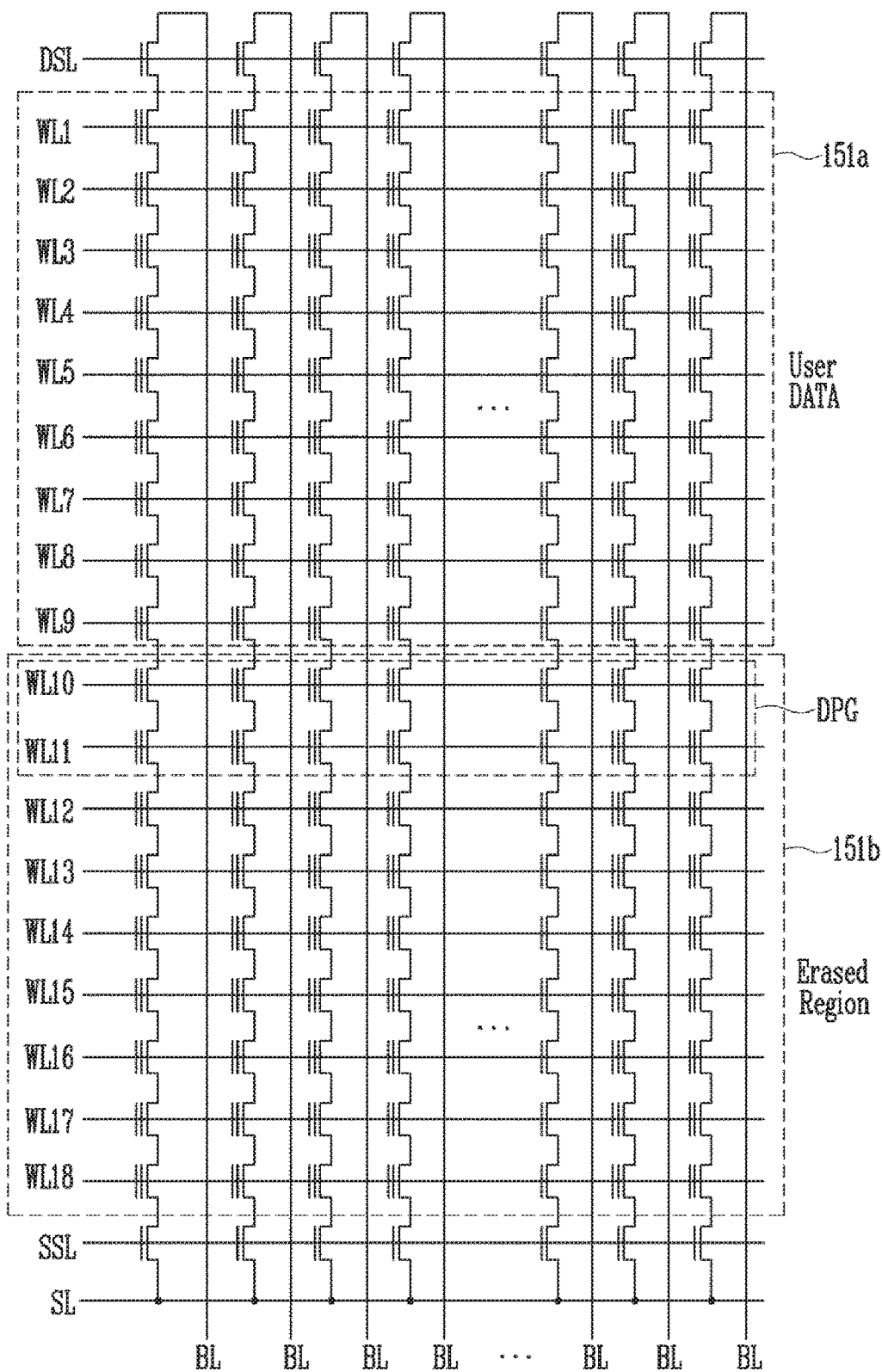

FIGS. 16 and 17 are diagrams illustrating a program operation when an erase state of memory cells has an intermediate level, according to an embodiment of the present disclosure. The operations of FIGS. 16 and 17 correspond to an example of the step S13 shown in FIG. 11.

FIG. 16 illustrates an embodiment when a threshold voltage is high (meaning that the threshold voltage is within the range th2≤Vth<th1) even when an erase state of memory cells has an intermediate level, and FIG. 17 illustrates an embodiment when a threshold voltage is low (meaning that the threshold voltage is within the range th3≤Vth<th2) even when an erase state of memory cells has an intermediate level.

Referring to FIG. 16, when a threshold voltage Vth of erased memory cells of a selected memory block is distributed between the first and second reference voltages th1 and th2, the dummy page number #_DP may be output as '1.' That is, when the dummy page number #_DP is '1_DP,' only one unselected page among the unselected pages included in the erased region 151b may be selected as a dummy page DPG. For example, when user data User DATA is programmed to the selected pages 151a, dummy data may be programmed to only the selected one dummy page DPG among the unselected pages included in the erased region 151b. For example, when the user data User DATA is programmed in the pages up to the ninth word line WL9, a tenth word line WL10 corresponding to a next address of the ninth word line WL9 may be selected, and a page connected to the tenth word line WL10 may be selected as the dummy page DPG. The selected pages 151a to which the user data User DATA is programmed and the other pages except the dummy page DPG to which the dummy data is programmed may maintain the erase state.

Referring to FIG. 17, when a threshold voltage Vth of erased memory cells included in a selected memory block is distributed between the second and third reference voltages th2 and th3, the dummy page number #_DP may be output as '2.' That is, when the dummy page number #_DP is '2_DP,' only two unselected pages among the unselected pages included in the erased region 151b may be selected as dummy pages DPG. For example, when user data User DATA is programmed to the selected pages 151a, dummy data may be programmed to only the selected two dummy pages DPG among the unselected pages included in the erased region 151b. For example, when the user data User DATA is programmed in the pages up to the ninth word line WL9, tenth and eleventh word lines WL10 and WL11 corresponding to next addresses of the ninth word line WL9 may be selected, and pages connected to the tenth and eleventh word lines WL10 and WL11 may be selected as the dummy pages DPG. The selected pages 151a to which the user data User DATA is programmed and the other pages except the dummy pages DPG to which the dummy data is programmed may maintain the erase state.

Figure 18:
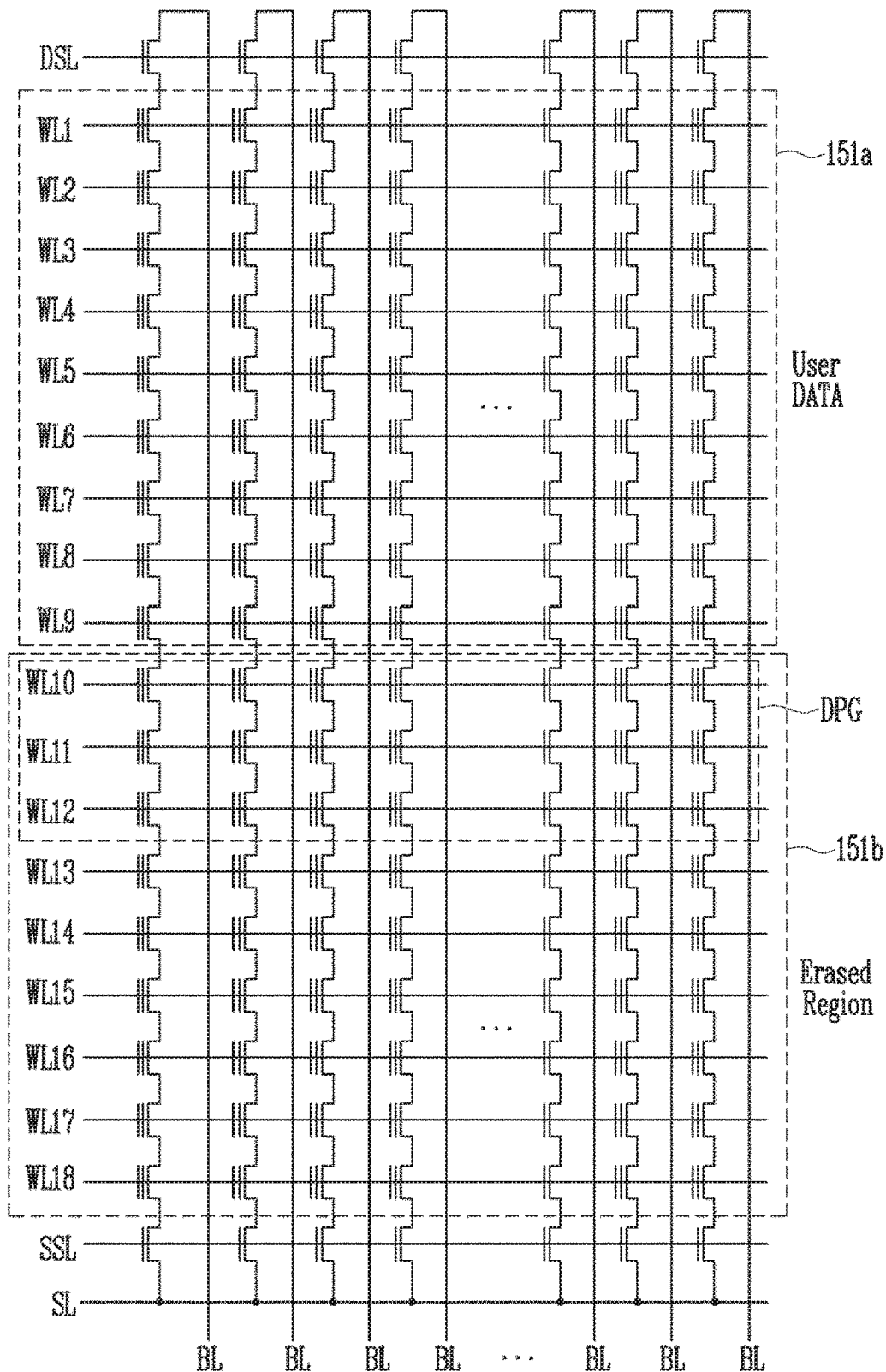
FIG. 18 is a diagram illustrating a program operation when an erase state of memory cells has a deep level, according to an embodiment of the present disclosure.

FIG. 18 is a diagram illustrating a program operation when an erase state of memory cells has a deep level, according to an embodiment of the present disclosure. The operation of FIG. 18 corresponds to an example of the step S13 shown in FIG. 11.

Referring to FIG. 18, when the erase state of the selected memory block is deep (Vth<th3), programmed memory cells may be considerably influenced by erased memory cells, and therefore, a large number of dummy pages may be selected. For example, in an open block in which the program operation is performed on only some pages of the selected memory block, unselected pages 151b that are not programmed maintain the erase state. When the erase state of the memory cells that maintain the erase state is deep, the memory cells are considerably influenced by a threshold voltage of the erased memory cells, and therefore, the number of pages selected as dummy pages among the unselected pages may increase.

For example, when user data User DATA is programmed to the selected pages 151a, dummy data may be programmed to only selected three dummy pages DPG among the unselected pages included in the erased region 151b. For example, when the user data User DATA is programmed in the pages up to the ninth word line WL9, tenth to twelfth word lines WL10 to WL12 corresponding to next addresses of the ninth word line WL9 may be selected, and pages connected to the tenth to twelfth word lines WL10 to WL12 may be selected as the dummy pages DPG. The selected pages 151a to which the user data User DATA is programmed and the other pages except the dummy pages DPG to which the dummy data is programmed may maintain the erase state.

Figure 19:
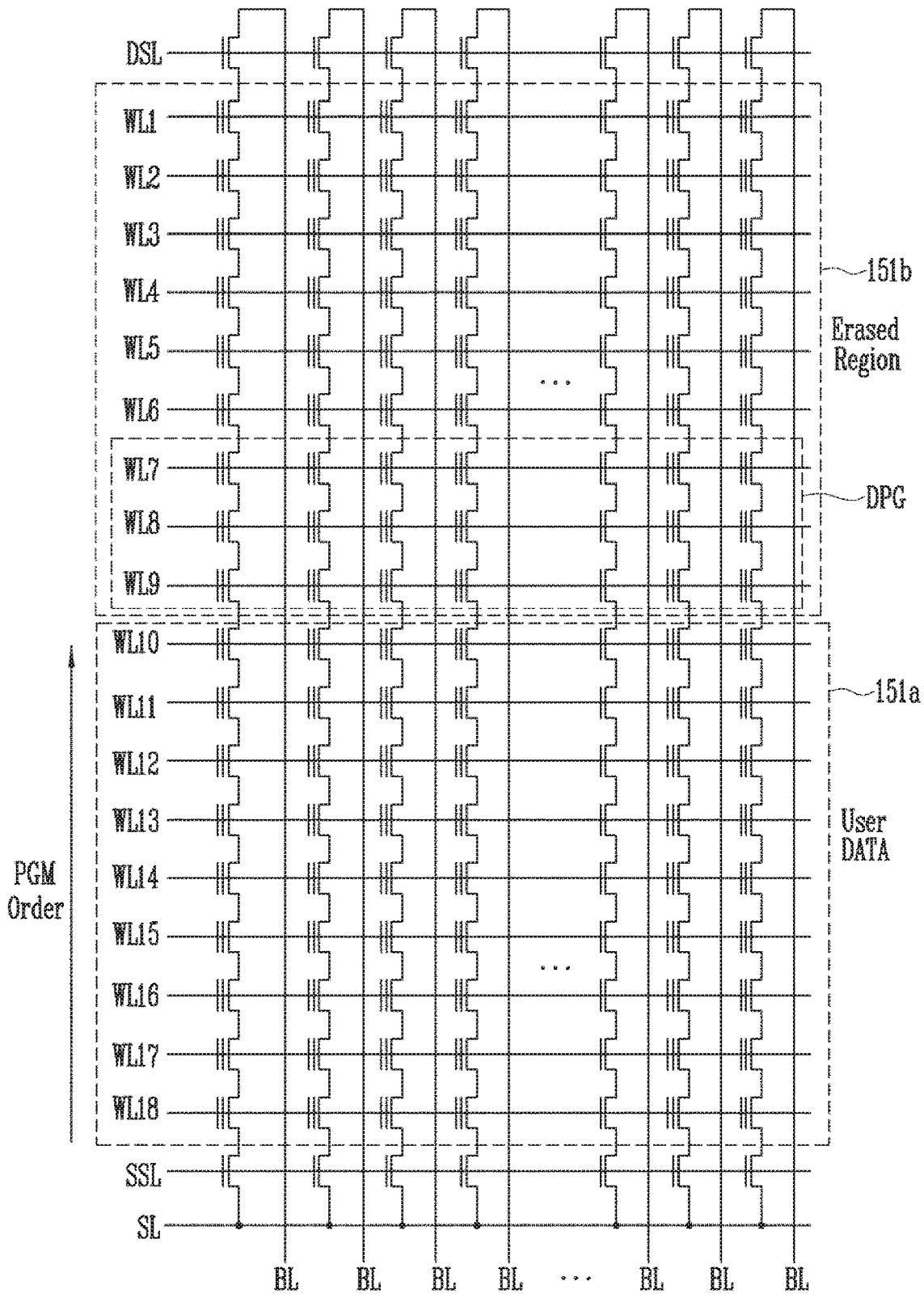
FIG. 19 is a diagram illustrating a program operation according to another embodiment of the present disclosure.

FIG. 19 is a diagram illustrating a program operation according to an embodiment of the present disclosure. The operation of FIG. 19 corresponds to an example of the step S13 shown in FIG. 11.

Referring to FIG. 19, an embodiment when the program operation is performed on pages from a page adjacent to the source select line SSL is illustrated. When the selected memory block is a three-dimensional memory block, the program operation may be performed on pages from a page located at a lowermost end. When a word line adjacent to the source select line SSL is the eighteenth word line WL18, selected pages 151a in which user data User DATA is stored may be located at a lower end portion in the selected memory block, and unselected pages 151b may be located at an upper end portion in the selected memory block. Among the unselected pages 151b, pages to ninth to seventh word lines WL9 to WL7 adjacent to the selected pages 151a may be selected as dummy pages DPG.

Figure 20:
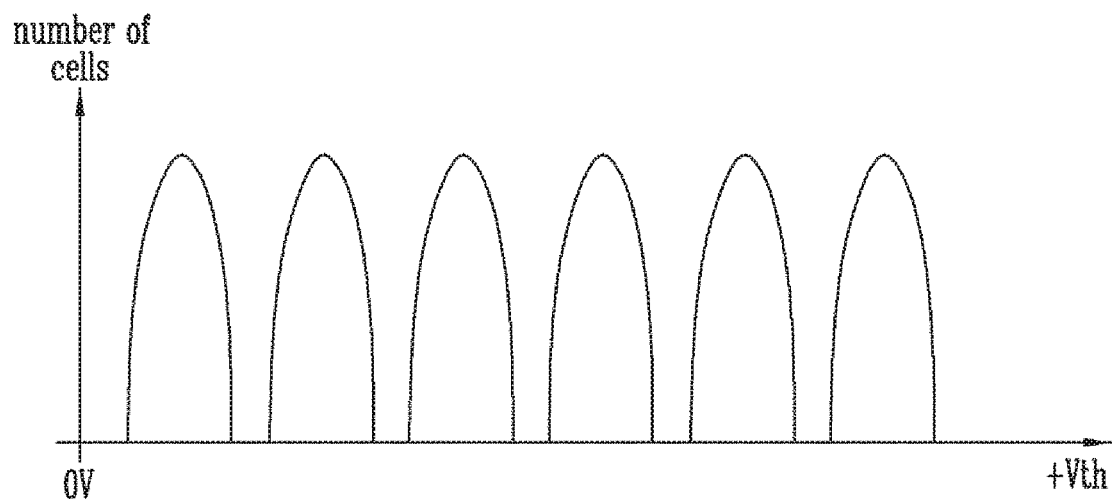
FIG. 20 is a diagram illustrating a threshold voltage of memory cells according to an embodiment of the present disclosure.

FIG. 20 is a diagram illustrating a threshold voltage of memory cells according to an embodiment of the present disclosure.

Referring to FIG. 20, as described in FIGS. 11 to 19, in the case of an open block, the number of dummy pages to which dummy data is to be programmed among unselected pages is set according to an erase state of memory cells included in a selected memory block, so that an unnecessary dummy program operation may be omitted.

Accordingly, a retention characteristic of memory cells included in selected pages may be improved by suppressing a change in threshold voltage of the memory cells, and the time required to perform a program operation may be reduced.

Figure 21:
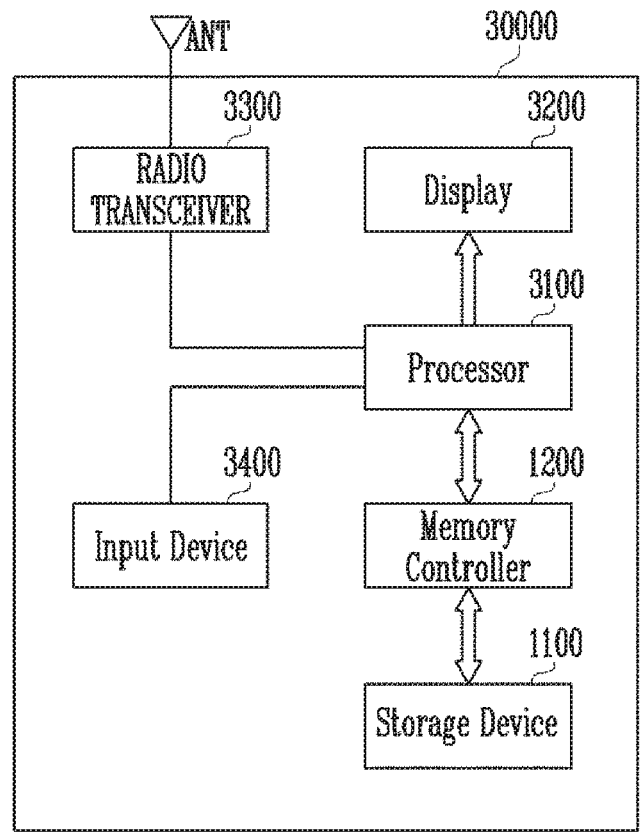
FIG. 21 is a diagram illustrating another embodiment of the memory system including the memory controller shown in FIG. 1.

FIG. 21 is a diagram illustrating a memory system 30000 according to an embodiment of the present disclosure, i.e., another embodiment of the memory system including the memory controller shown in FIG. 1.

Referring to FIG. 21, the memory system 30000 may be implemented as a cellular phone, a smart phone, a tablet personal computer (PC), a personal digital assistant (PDA), or a wireless communication device. The memory system 30000 may include a storage device 1100 and a memory controller 1200 capable of controlling an operation of the storage device 1100. The memory controller 1200 may control a data access operation of the storage device 1100, e.g., a program operation, an erase operation, a read operation, or the like under the control of a processor 3100.

Data programmed in the storage device 1100 may be output through a display 3200 under the control of the memory controller 1200.

A radio transceiver 3300 may transmit and receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the storage device 1100. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the storage device 1100 may be implemented as a part of the processor 3100, or be implemented as a chip separate from the processor 3100.

Figure 22:
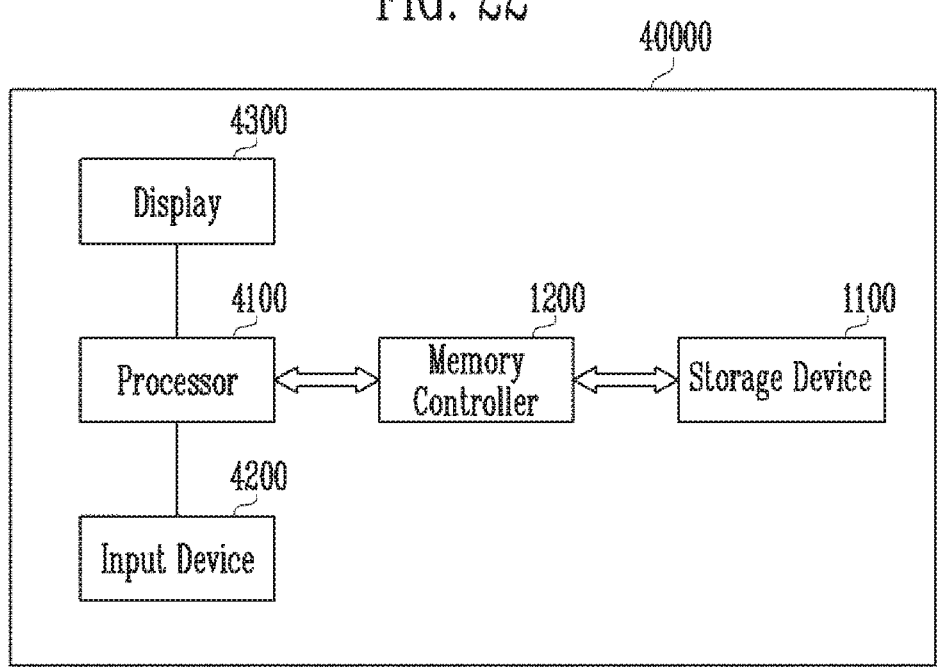
FIG. 22 is a diagram illustrating another embodiment of the memory system including the memory controller shown in FIG. 1.

FIG. 22 is a diagram illustrating a memory system 40000 according to an embodiment of the present disclosure, i.e., another embodiment of the memory system including the memory controller shown in FIG. 1.

Referring to FIG. 22, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include a storage device 1100 and a memory controller 1200 capable of controlling a data processing operation of the storage device 1100.

A processor 4100 may output data stored in the storage device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the storage device 1100 may be implemented as a part of the processor 4100, or be implemented as a chip separate from the processor 4100.

Figure 23:
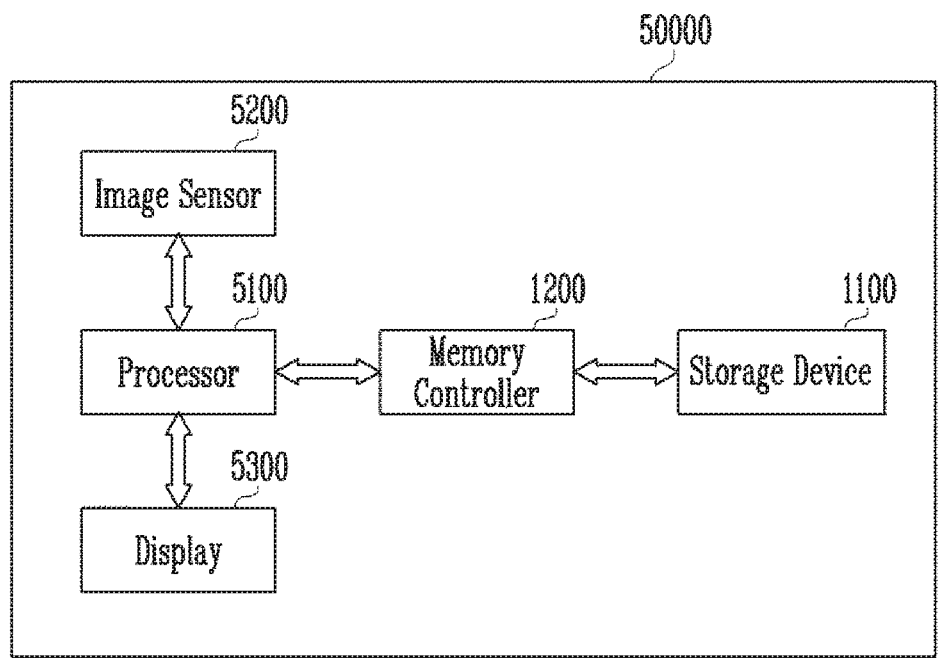
FIG. 23 is a diagram illustrating another embodiment of the memory system including the memory controller shown in FIG. 1.

FIG. 23 is a diagram illustrating a memory system 50000 according to an embodiment of the present disclosure, i.e., another embodiment of the memory system including the memory controller shown in FIG. 1.

Referring to FIG. 23, the memory system 50000 may be implemented as an image processing device, e.g., a digital camera, a mobile terminal having a digital camera attached thereto, a smart phone having a digital camera attached thereto, or a tablet PC having a digital camera attached thereto.

The memory system 50000 may include a storage device 1100 and a memory controller 1200 capable of controlling a data processing operation of the storage device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the storage device 1100 through the memory controller 1200. In addition, data stored in the storage device 1100 may be output through the display 5300 under the control of the processor 5100 or the memory controller 1200.

In some embodiments, the memory controller 1200 capable of controlling an operation of the storage device 1100 may be implemented as a part of the processor 5100, or be implemented as a chip separate from the processor 5100.

Figure 24:
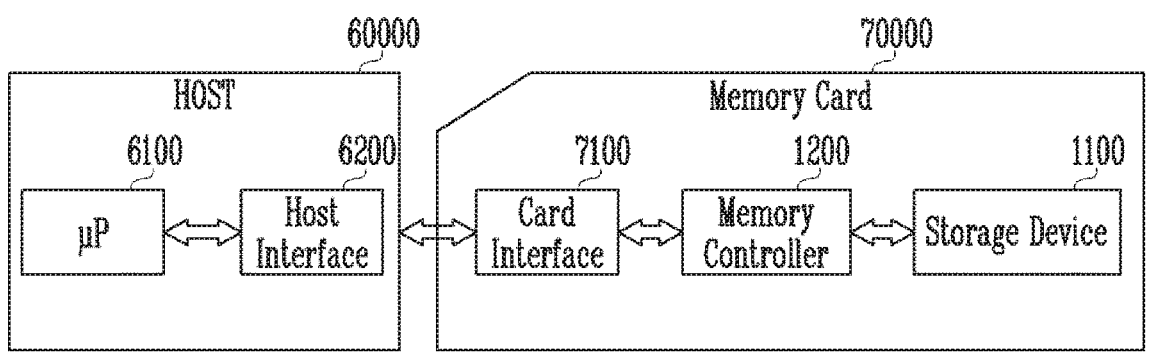
FIG. 24 is a diagram illustrating another embodiment of the memory system including the memory controller shown in FIG. 1.

FIG. 24 is a diagram illustrating a memory system 70000 according to an embodiment of the present disclosure, i.e., another embodiment of the memory system including the memory controller shown in FIG. 1.

Referring to FIG. 24, the memory system 70000 may be implemented as a memory card or a smart card. The memory system 70000 may include a storage device 1100, a memory controller 1200, and a card interface 7100.

The memory controller 1200 may control data exchange between the storage device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a PC, a tablet PC, a digital camera, a digital audio player, a cellular phone, console video game hardware, or a digital set-top box, the host interface 6200 may perform data communication with the storage device 1100 through the card interface 7100 and the memory controller 1200 under the control of a microprocessor (μP) 6100.

According to the present disclosure, the number of pages to which dummy data is to be programmed is determined according to a threshold voltage level of an erased memory cell, so that a retention characteristic of programmed memory cells may be improved. Accordingly, the reliability of the memory system may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory controller comprising:
a central processing unit configured to output a read command for checking an erase state of a selected storage block in response to a program request from a host, determine a number of pages to store dummy data in the selected storage block based on read data obtained by the read command, and output a program command to store the dummy data and user data corresponding to the program request in the selected storage block; and
a memory interface configured to generate the dummy data corresponding to the number of pages, and output the dummy data and the user data,
wherein the read data includes information indicating a voltage range, among a plurality of reference voltage ranges,
wherein threshold voltages of memory cells included in the selected storage block are within the voltage range, and
wherein the dummy data and the user data are stored in separate pages, respectively.

2. The memory controller of claim 1, wherein the central processing unit includes:
a received request detector configured to output a read sub-request, an erase sub-request, or a program sub-request in response to a request received from the host; and
a command generator configured to output the program command, the read command or an erase command in response to the program sub-request, the read sub-request or the erase sub-request.

3. The memory controller of claim 2, wherein the received request detector:
when the request received from the host is the program request or a read request, outputs the read sub-request,
when the request received from the host is an erase request, outputs the erase sub-request, and
when a program signal is received, outputs the program sub-request.

4. The memory controller of claim 3, wherein the central processing unit includes an erase state table manager configured to output the number of pages and the program signal according to threshold voltage information of the selected storage block, which corresponds to the erase state.

5. The memory controller of claim 4, wherein the erase state table manager includes:
registers having the plurality of reference voltage ranges and indicating the number of pages respectively allocated to the plurality of reference voltage ranges which include threshold voltages; and
a circuit configured to output the program signal when the threshold voltage information is received.

6. The memory controller of claim 5, wherein the number of pages includes a value where the number of pages decreases when the threshold voltages of the memory cells included in the selected storage block increases.

7. The memory controller of claim 2, wherein the memory interface includes:
a command queue manager configured to queue the commands received from the command generator, and sequentially output queued commands;
a parameter register configured to store voltages and time values, which are set to perform program, read, and erase operations, and output parameter information including information of setting values suitable for each operation;
a data manager configured to temporarily store and output the user data, and selectively generate and output the dummy data according to the number of pages; and
an address buffer configured to output a physical address of the selected storage block, which corresponds to a logical address received from the host, or output an address of the selected storage block when the received logic address does not exist.

8. The memory controller of claim 7, wherein the data manager includes:
a data buffer configured to temporarily store and output the user data; and
a dummy data generator configured to generate and output the dummy data.

9. The memory controller of claim 7, wherein the address buffer:
when a read request is received from the host, outputs the physical address of the selected storage block, which corresponds to the received logical address, together with the read request, and
when a program request is received from the host, outputs the physical address of the selected storage block.

10. A memory system comprising:
a memory device configured to store data; and
a memory controller configured to, when a program request is received from a host, determine a number of pages to store dummy data in a selected storage block based on read data obtained by a read command for checking an erase state of the selected storage block among unselected pages of the selected storage block, and store the dummy data and user data corresponding to the program request in the selected storage block, wherein the read data includes information indicating a voltage range, among a plurality of reference voltage ranges, wherein threshold voltages of memory cells included in the selected storage block are within the voltage range, and wherein the dummy data and the user data are stored in separate pages, respectively.

11. The memory system of claim 10, wherein the memory controller reads a selected page of the selected storage block, and determines the erase state of the selected storage block, based on a read result, so as to check the erase state of the selected storage block when the program request is received from the host.

12. The memory system of claim 11, wherein the memory controller, based on the read result, when threshold voltages of erased memory cells included in the selected storage block are greater than a reference voltage, does not select the pages, and when the threshold voltages of the erased memory cells included in the selected storage block are less than the reference voltage, selects the pages.

13. The memory system of claim 12, wherein the pages are selected among the unselected pages to which the user data is not stored in the selected storage block.

14. The memory system of claim 11, wherein, among a plurality of pages included in the selected storage block, memory cells of the other pages except the separate pages in which the user data and the dummy data are stored maintain the erase state.

15. The memory system of claim 12, wherein, when the threshold voltages of the erased memory cells included in the selected storage block are less than the reference voltage, the memory controller selects the number of pages according to threshold voltage levels of the memory cells.

16. The memory system of claim 15, wherein the memory controller sets a plurality of different reference voltages, and selects the number of pages, based on which range the threshold voltages of the erased memory cells are included in.

17. The memory system of claim 16, wherein the memory controller:

increases the number of pages when the threshold voltages of the erased memory cells decrease; and decreases the number of pages when the threshold voltages of the erased memory cells increase.

18. The memory system of claim 16, wherein the memory controller performs a dummy program operation on some pages according to the number of pages.

* * * * *